US012701846B2

(12) United States Patent
Zhu et al.

(10) Patent No.: US 12,701,846 B2
(45) Date of Patent: Aug. 4, 2026

(54) LED DEVICE AND METHOD OF MANUFACTURE

(71) Applicant: PORO TECHNOLOGIES LTD, Cambridge (GB)

(72) Inventors: Tongtong Zhu, Cambridge (GB); Yingjun Liu, Cambridge (GB); Muhammad Ali, Cambridge (GB)

(73) Assignee: PORO TECHNOLOGIES LTD, Cambridge (GB)

(*) Notice: Subject to any disclaimer, the term of this patent is extended or adjusted under 35 U.S.C. 154(b) by 737 days.

(21) Appl. No.: 18/040,529

(22) PCT Filed: Aug. 4, 2021

(86) PCT No.: PCT/GB2021/052022
§ 371 (c)(1),
(2) Date: Feb. 3, 2023

(87) PCT Pub. No.: WO2022/029436
PCT Pub. Date: Feb. 10, 2022

(65) Prior Publication Data
US 2023/0290806 A1 Sep. 14, 2023

(30) Foreign Application Priority Data

Aug. 4, 2020 (GB) ..................................... 2012098
Aug. 4, 2020 (GB) ..................................... 2012103
(Continued)

(51) Int. Cl.
*H10H 29/14* (2025.01)
*H10H 20/01* (2025.01)
(Continued)

(52) U.S. Cl.
CPC ...... *H10H 29/142* (2025.01); *H10H 20/0137* (2025.01); *H10H 20/812* (2025.01);
(Continued)

(58) Field of Classification Search
CPC ............. H10H 29/142; H10H 20/0137; H10H 20/812; H10H 20/817; H01L 25/0753
See application file for complete search history.

(56) References Cited

U.S. PATENT DOCUMENTS 10,361,341 B2 7/2019 Danesh et al.
10,651,357 B2 5/2020 Andrews
(Continued)

FOREIGN PATENT DOCUMENTS

CN 106165125 A 11/2016
CN 107946417 A 4/2018
(Continued)

OTHER PUBLICATIONS

Pasayat, Shubhra S. et al., "Growth of strain-GaN on micrometer-sized patterned compliant relaxedInGaN", Applied Physics Letters, Jan. 16, 2020, vol. 116, No. 11, p. 1-5.
(Continued)

*Primary Examiner* — Ratisha Mehta
(74) *Attorney, Agent, or Firm* — MERCHANT & GOULD P.C.

(57) ABSTRACT

A method of manufacturing an LED device comprises the steps of: forming an n-doped connecting layer of III-nitride material over a porous region of III-nitride material; forming a first electrically-insulating mask layer on the n-doped connecting layer; removing a portion of the first mask layer to expose a first exposed region of the n-doped connecting layer; forming a first LED structure, which is configured to emit light at a first emission wavelength, on the first exposed region of the n-doped connecting layer; forming a second
(Continued)

electrically-insulating mask layer over the first LED structure and the n-doped connecting layer; removing a portion of the second mask layer to expose a second exposed region of the n-doped connecting layer; and forming a second LED structure, which is configured to emit light at a second emission wavelength different from the first emission wavelength, on the second exposed region of the n-doped connecting layer. An LED device, an array of LEDs, and a three colour LED device are also provided.

22 Claims, 17 Drawing Sheets

(30)          Foreign Application Priority Data

| | | |
|---|---|---|
| Aug. 4, 2020 | (GB) | ...................................... 2012105 |
| Aug. 4, 2020 | (GB) | ...................................... 2012108 |
| Aug. 4, 2020 | (GB) | ...................................... 2012110 |
| Nov. 16, 2020 | (GB) | ...................................... 2018016 |
| Jan. 22, 2021 | (WO) | ............... PCT/GB2021/050147 |
| Jan. 22, 2021 | (WO) | ............... PCT/GB2021/050152 |
| Jan. 22, 2021 | (WO) | ............... PCT/GB2021/050158 |
| Feb. 12, 2021 | (GB) | ...................................... 2102012 |
| Feb. 12, 2021 | (GB) | ...................................... 2102017 |
| Feb. 12, 2021 | (GB) | ...................................... 2102021 |

(51)  Int. Cl.
   *H10H 20/812*          (2025.01)
   *H10H 20/817*          (2025.01)
   *H10H 20/825*          (2025.01)
   *H10W 90/00*          (2026.01)

(52)  U.S. Cl.
   CPC ...... *H10H 20/817* (2025.01); *H10H 20/8252* (2025.01); *H10W 90/00* (2026.01)

(56)          References Cited

U.S. PATENT DOCUMENTS

| | | | |
|---|---|---|---|
| 2005/0199883 A1 | 9/2005 | Borghs et al. | |
| 2009/0001416 A1 | 1/2009 | Chua et al. | |
| 2009/0140274 A1* | 6/2009 | Wierer, Jr. | ........... H10H 20/018 |
| | | | 257/97 |
| 2010/0051972 A1 | 3/2010 | Chen et al. | |
| 2010/0140629 A1 | 6/2010 | Lee et al. | |
| 2011/0193059 A1 | 8/2011 | Wierer, Jr. et al. | |
| 2013/0146842 A1 | 6/2013 | Kim et al. | |
| 2015/0125981 A1* | 5/2015 | Ryu | .................. H01L 21/76259 |
| | | | 438/47 |
| 2016/0197232 A1* | 7/2016 | Bour | ...................... H10H 20/81 |
| | | | 257/13 |
| 2017/0237234 A1* | 8/2017 | Han | ...................... H01S 5/1042 |
| | | | 372/45.012 |
| 2018/0332677 A1 | 11/2018 | Ku et al. | |
| 2019/0123235 A1 | 4/2019 | Cho et al. | |
| 2019/0214529 A1* | 7/2019 | Ahmed | .................. H10H 20/82 |
| 2020/0152841 A1 | 5/2020 | Han et al. | |
| 2020/0227255 A1 | 7/2020 | Zhu et al. | |
| 2022/0190026 A1 | 6/2022 | Levy et al. | |
| 2023/0051845 A1 | 2/2023 | Zollner et al. | |
| 2023/0085036 A1 | 3/2023 | Mezouari et al. | |
| 2023/0215906 A1 | 7/2023 | Cheng | |

FOREIGN PATENT DOCUMENTS

| | | |
|---|---|---|
| CN | 109768135 B | 6/2020 |
| JP | H11-145513 A | 5/1999 |
| JP | 2004-079933 A | 3/2004 |
| JP | 2006-121037 A | 5/2006 |
| JP | 2007-27298 A | 2/2007 |
| JP | 2007-335879 A | 12/2007 |
| JP | 2009-21361 A | 1/2009 |
| JP | 2012195529 A | 10/2012 |
| JP | 2013-051437 A | 3/2013 |
| JP | 2014-127708 A | 7/2014 |
| JP | 2016-527706 A | 9/2016 |
| JP | 2018-502436 A | 1/2018 |
| JP | 2018-533847 A | 11/2018 |
| JP | 2019-516251 A | 6/2019 |
| KR | 10-1136063 B1 | 4/2012 |
| TW | 201921716 A | 6/2019 |
| WO | 2009/038324 A2 | 3/2009 |
| WO | 2013/140320 A1 | 9/2013 |
| WO | 2018/080860 A1 | 5/2018 |
| WO | 2019/027820 A1 | 2/2019 |
| WO | 2019/063957 | 4/2019 |
| WO | 2019/145728 | 8/2019 |

OTHER PUBLICATIONS

Zhao, S. et al., "Molecular Beam Epitaxy of III-Nitride Nanowires: Emerging Applications from Deep-Ultraviolet Light Emitters and Micro-LEDs to Artificial Photosynthesis", 03 IEEE Nanotechnology Magazine, Mar. 4, 2019, vol. 13, No. 2 p. 6-16.

International Search Report and Written Opinion of PCT/GB2021/052022, Nov. 2, 2021, 15 pages.

Exam Report for European Patent Application No. 21752137.6 (Jan. 21, 2025).

Inatomi et al., "Theoretical study of the composition pulling effect in InGaN metalorganic vapor-phase epitaxy growth," Japanese Journal of Applied Physics, vol. 56, No. 7 (2017).

International Search Report and Written Opinion for No. PCT/GB2021/050147 (Apr. 9, 2021).

International Search Report and Written Opinion for PCT/GB2021/050152 (Apr. 15, 2021).

International Search Report and Written Opinion for PCT/GB2021/050158 (Apr. 15, 2021).

International Search Report and Written Opinion for PCT/GB2021/052019 (Nov. 2, 2021).

International Search Report and Written Opinion for PCT/GB2021/052023 (Nov. 2, 2021).

Office Action for Japanese Patent Application No. 2022-544132 (Aug. 13, 2024).

\* cited by examiner

Figure
22
Figure
23
Figure
24
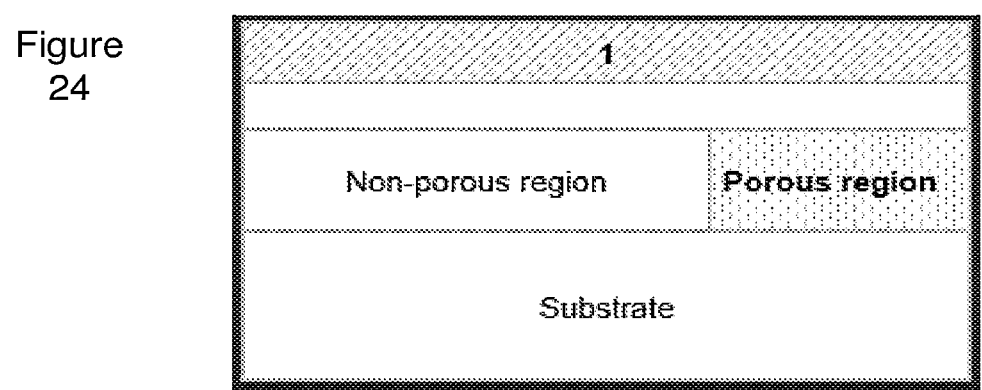

Figure
25
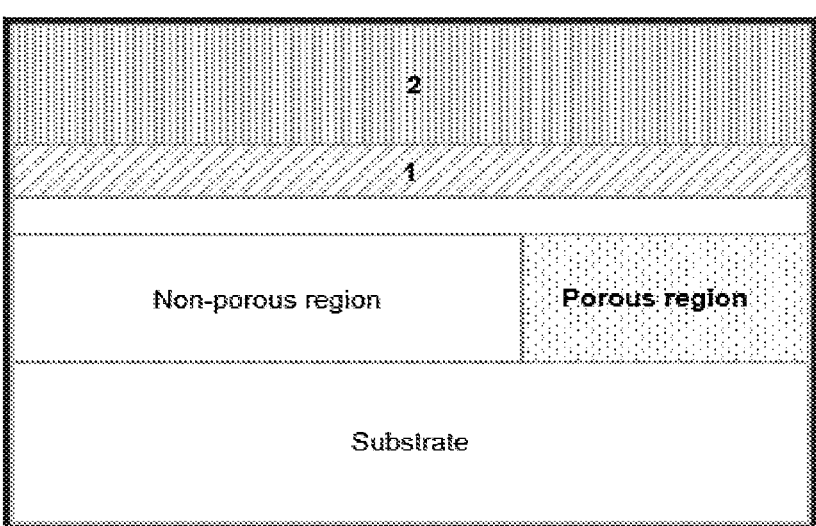
Figure
26
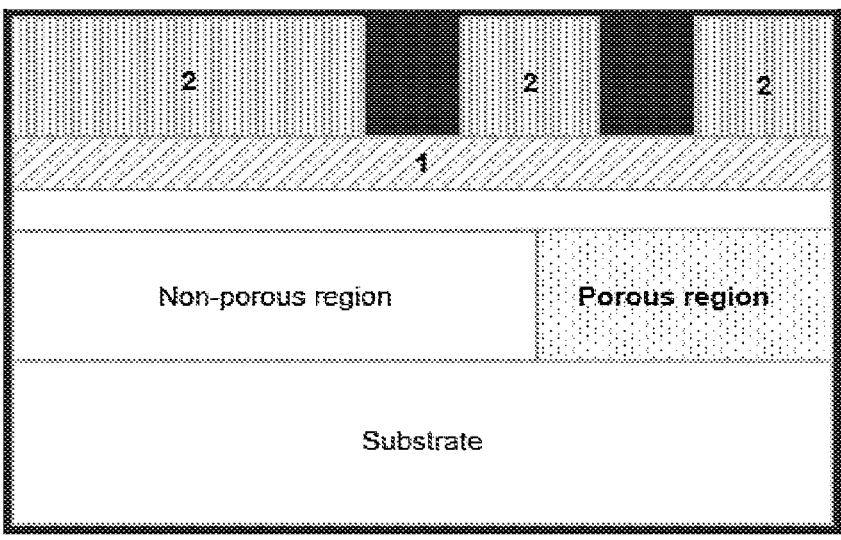
Figure
27
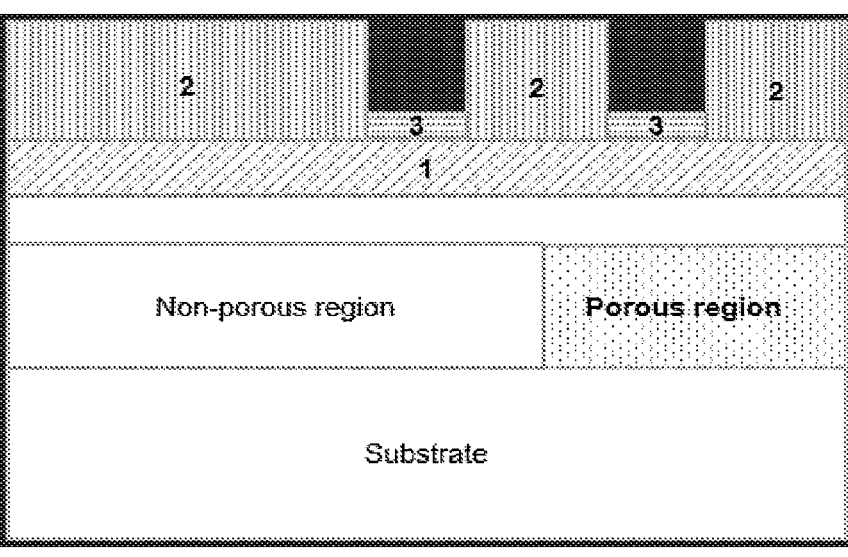

Figure
28
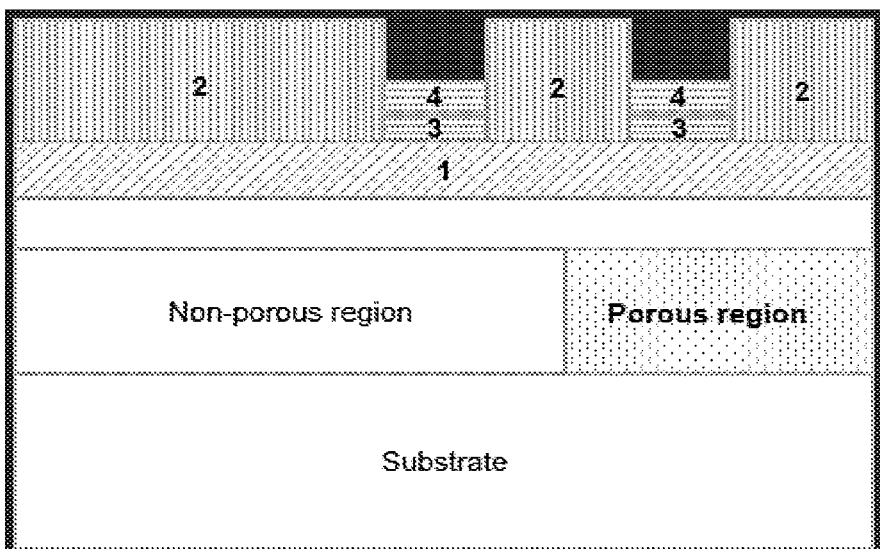
Figure
29
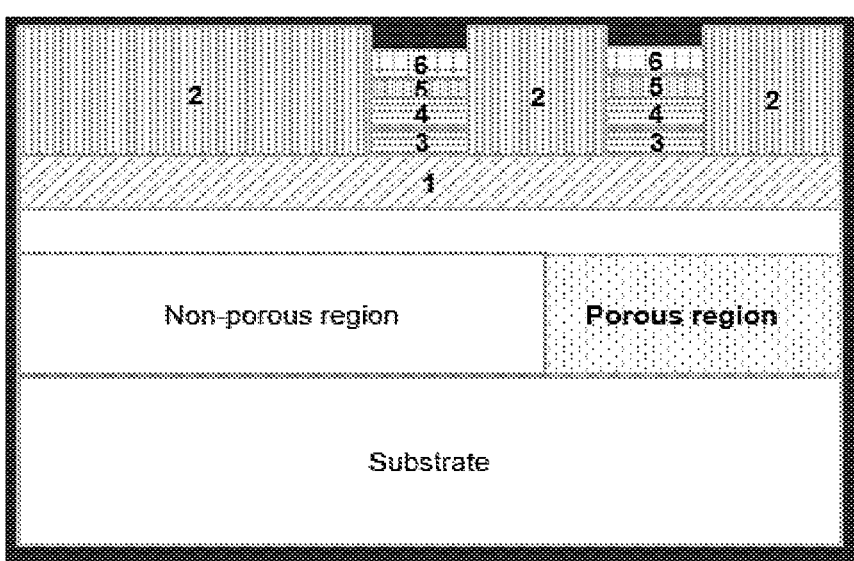
Figure
30
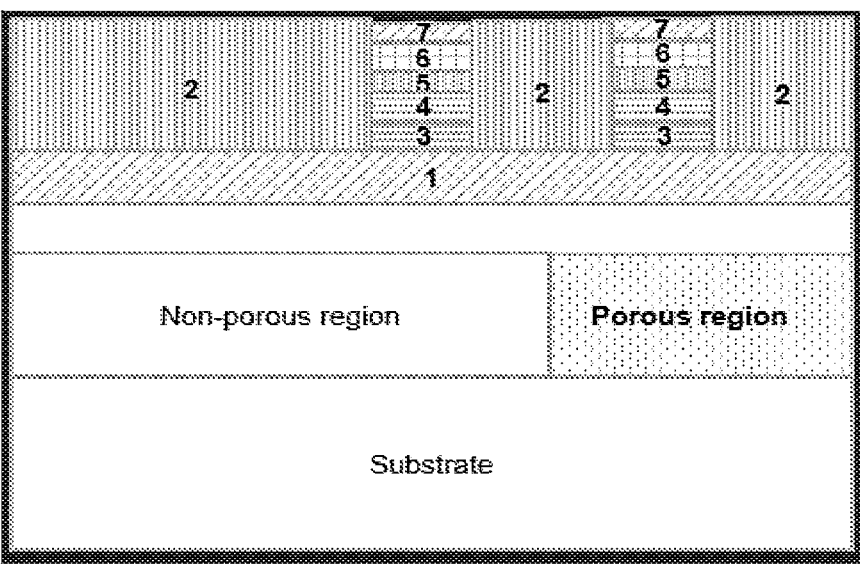

Figure
31
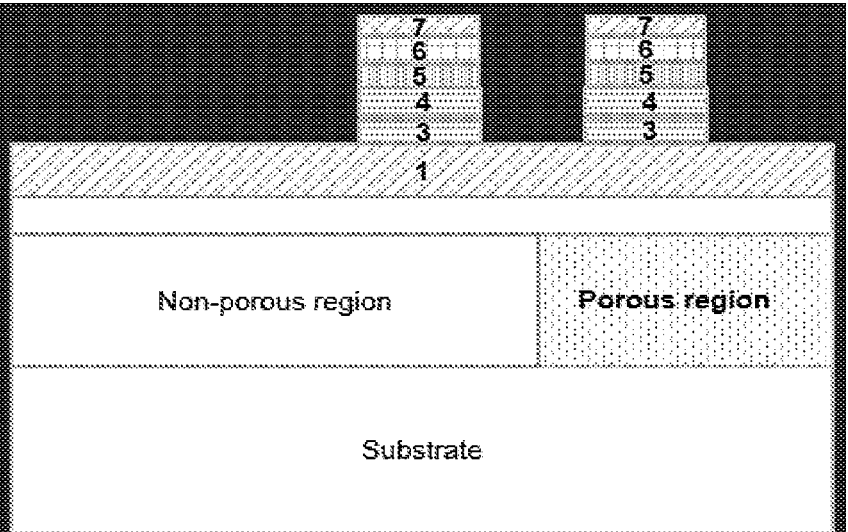
Figure
32
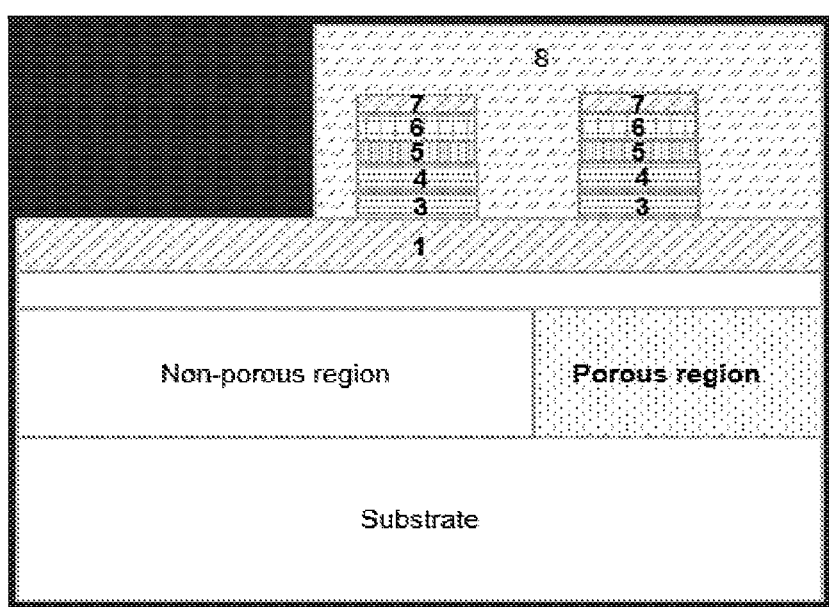
Figure
33
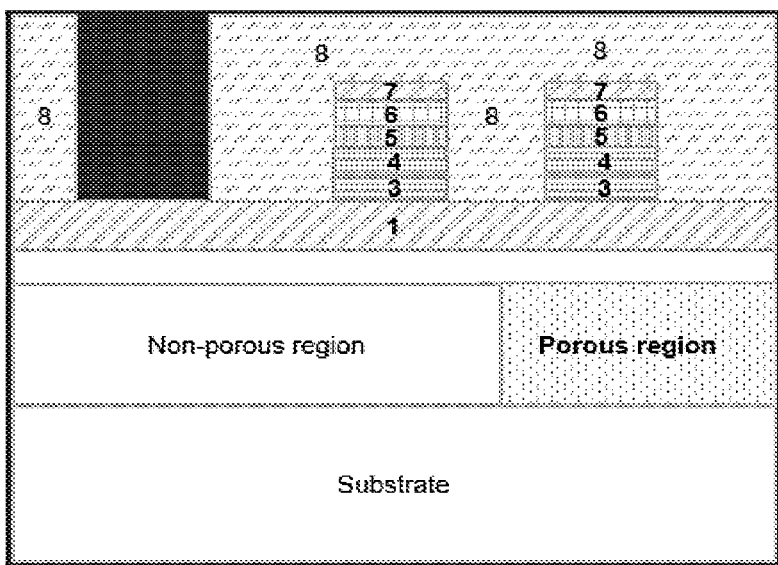

Figure
34
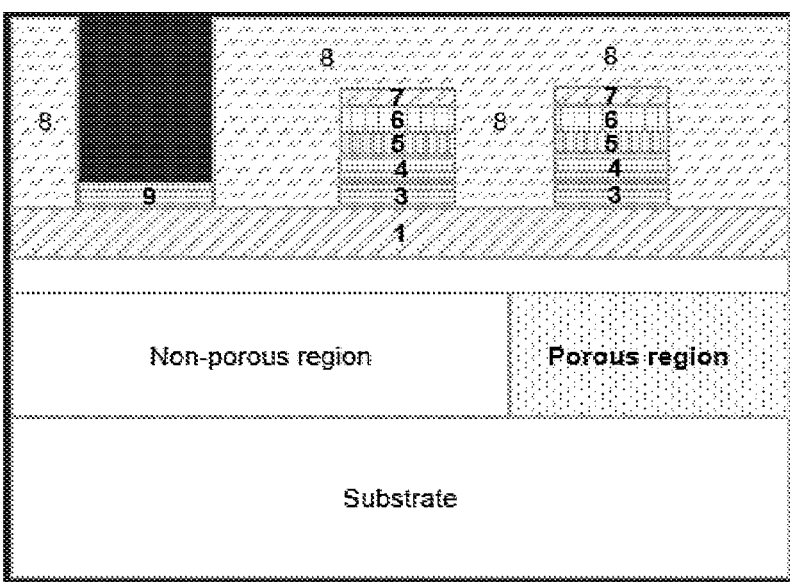
Figure
35
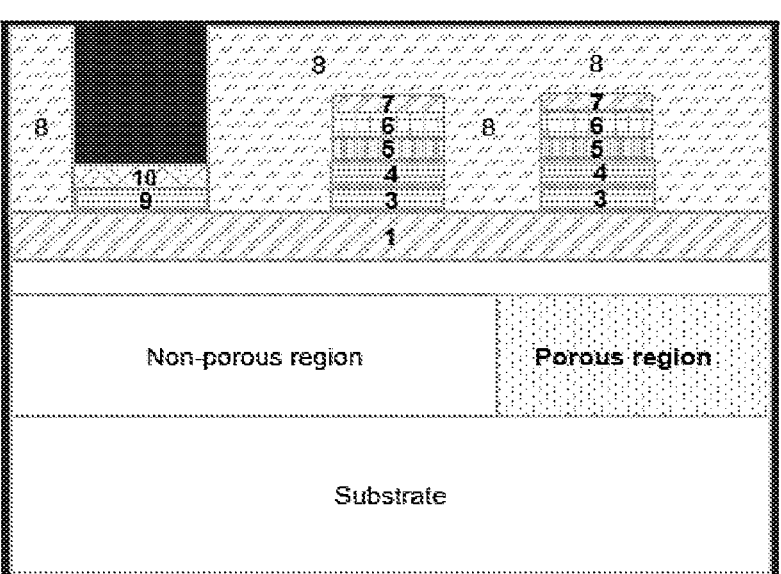
Figure
36
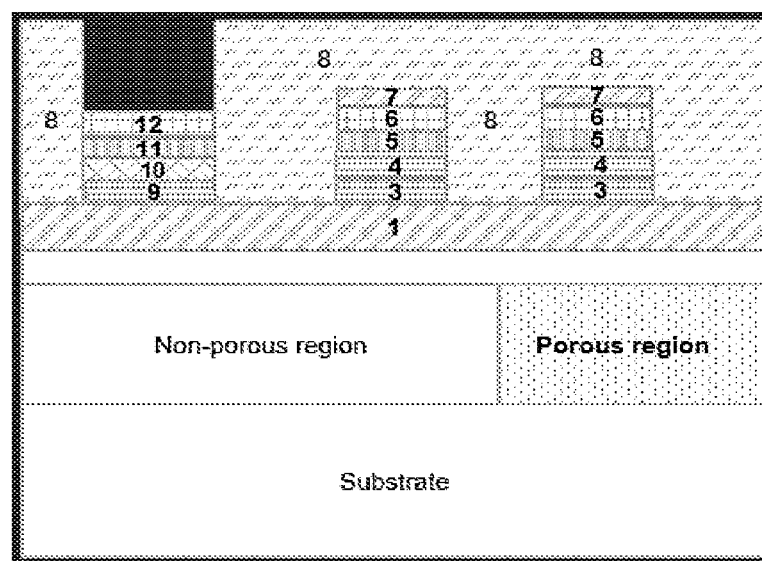

Figure
37
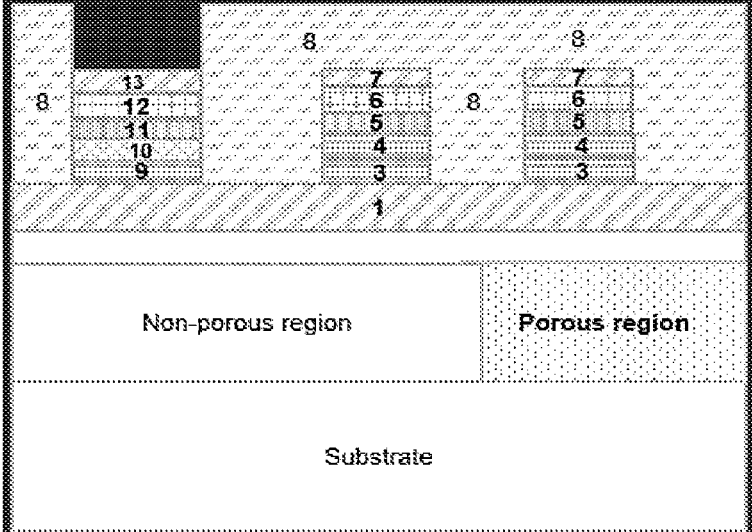
Figure
38
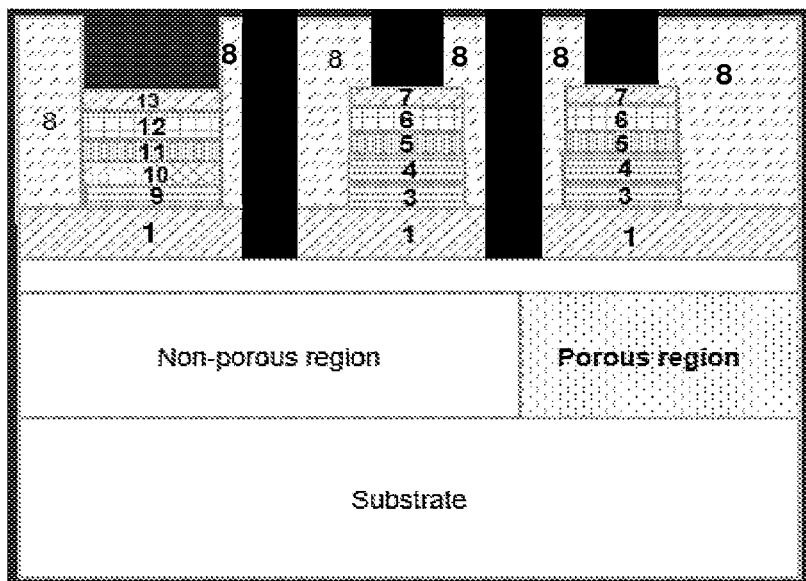
Figure
39
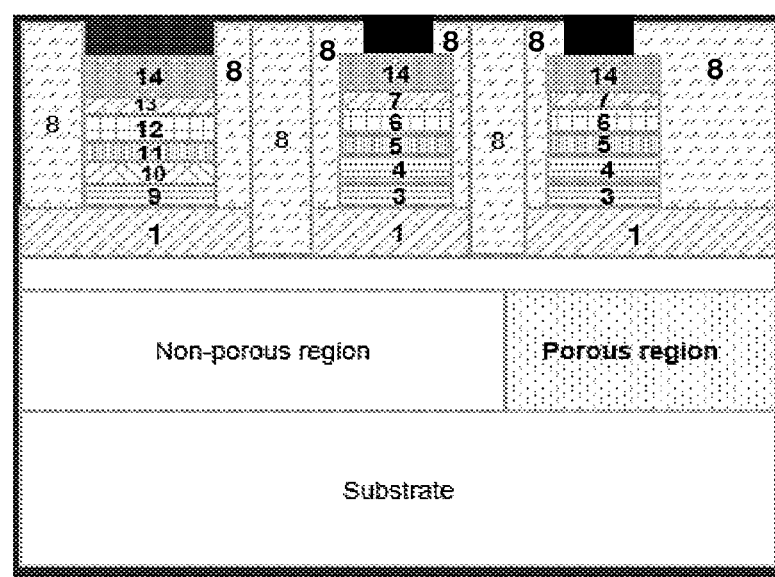

Figure
40
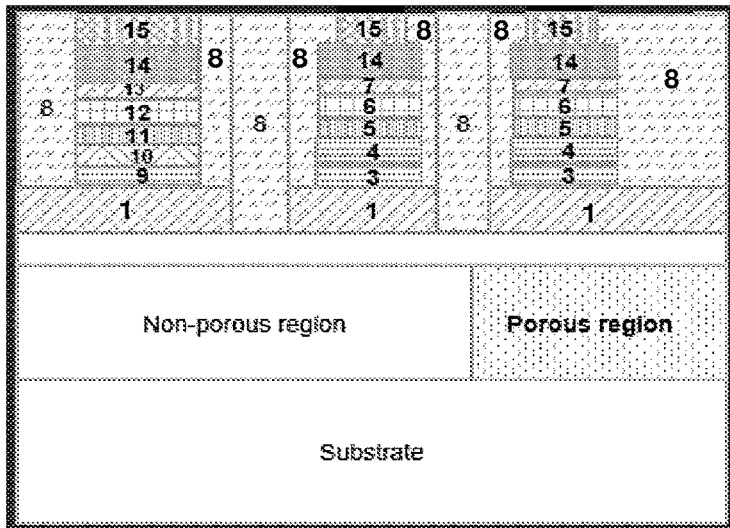
Figure
41
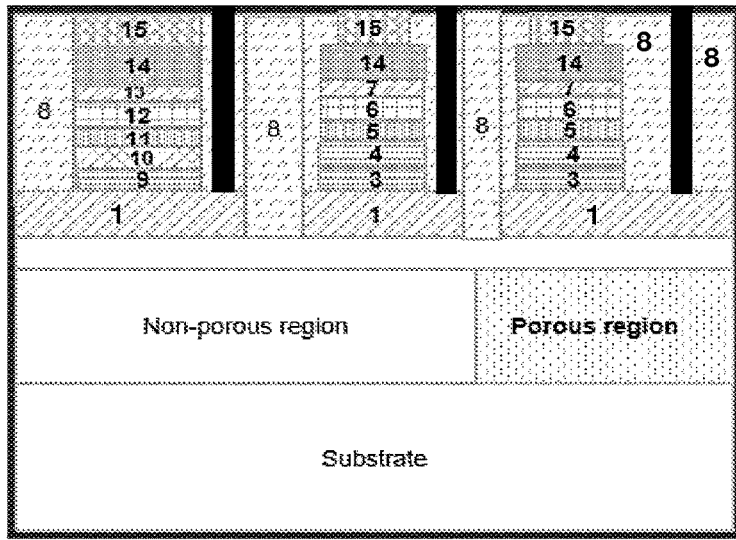
Figure
42
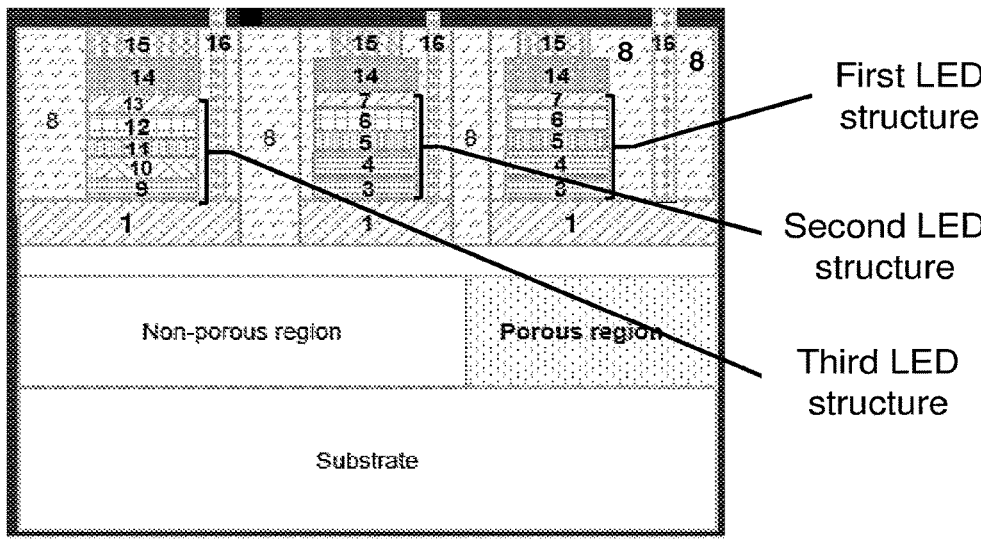
First LED
structure
Second LED
structure
Third LED
structure Figure
43
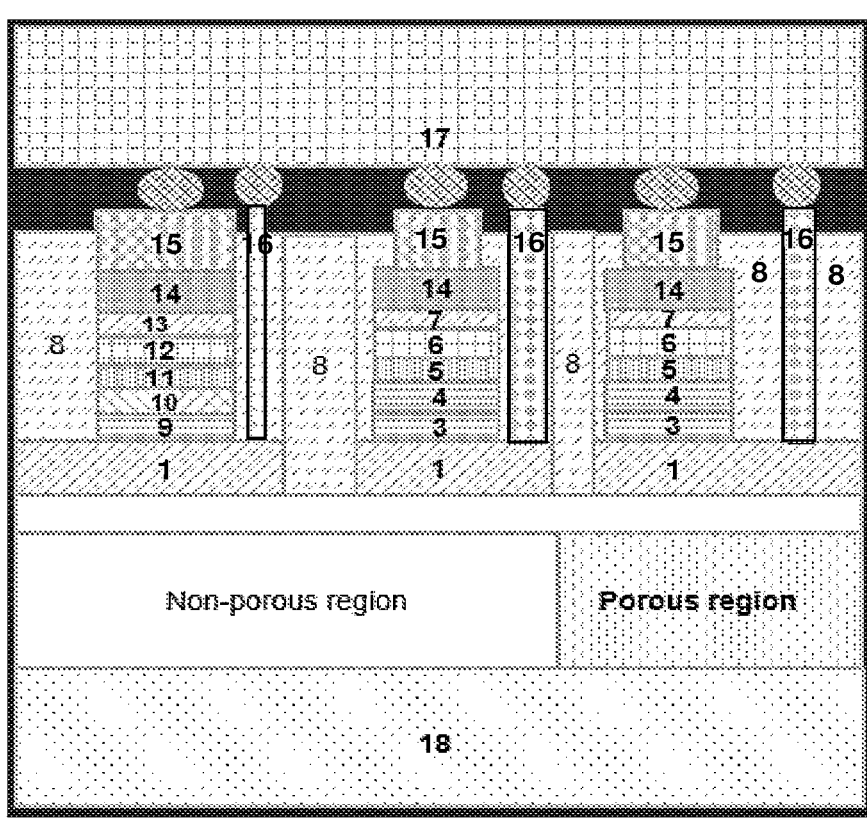
Figure
44
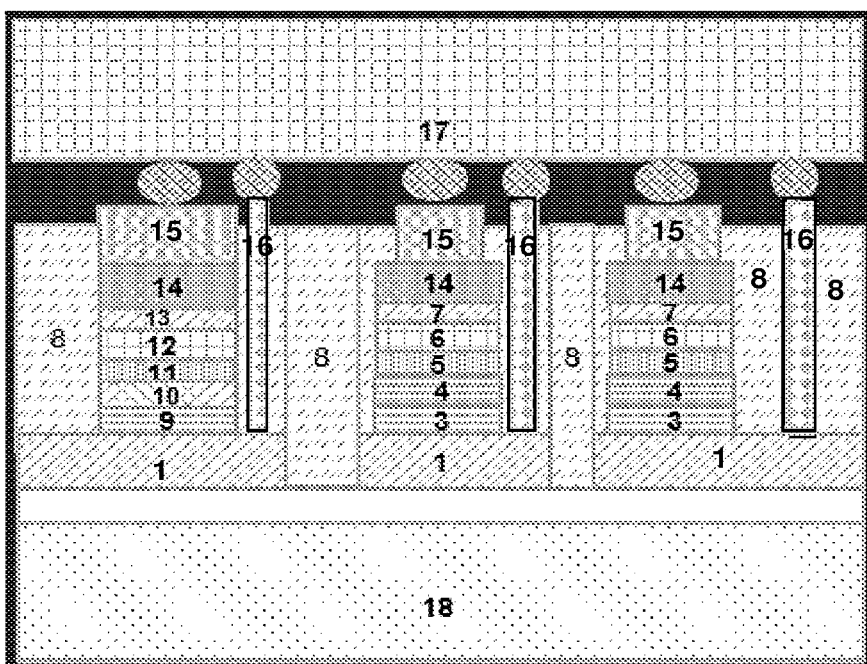

LED DEVICE AND METHOD OF MANUFACTURE

The present invention relates to semiconductor devices and a method of manufacture for semiconductor devices, in particular to LED devices, arrays of LED devices and an improved method of manufacturing LED devices.

BACKGROUND

Standard light-emitting diodes (LEDs) for light emission are normally larger than 200 μm×200 μm. Micro-LEDs are arrays of micro-scale LEDs with high density with lateral size down to less than 100 μm×100 μm. So a micro-LED may be defined as an LED structure with lateral dimensions (Length and width) smaller than 100 μm×100 μm all the way down to a few tens of nanometers or even smaller.

In the past, attempts have been made to manufacture micro-LEDs using known techniques. For example, prior attempts have used normal LED epitaxy and laser lift-off, electrostatic carry, and elastomer stamp for the transfer. However, there are problems with applying this approach to devices as small as micro-LEDs.

These problems include:
Using normal LED epitaxy, it is challenging to generate all three main colours (RGB: red, green, blue) on the same chip of micro-LEDs.
Efficiencies are low for green and red micro-LEDs.
Dry etching is always needed to define micro-scale LED mesas. As LED sizes are smaller, plasma damage to the side wall of the LED structure will influence the emission efficiency and lifetime of the devices.
Laser lift-off is low yield and costly.
Transfer printing—low yield due to pre-existing strain/bow issues.

Due to these problems, conventional LED manufacture techniques are not satisfactory for the production of high quality micro-LEDs. In particular, conventional LED manufacture techniques are not satisfactory for the production of multi-colour LED devices comprising LEDs of multiple different colours on the same substrate.

SUMMARY OF INVENTION

The present application relates to an improved method of manufacturing LED devices, and to LED devices made using that method. The present invention is defined in the independent claims, to which reference should now be made. Preferred or advantageous features of the invention are set out in the dependent sub-claims.

The LED device is preferably formed from III-V semiconductor material, particularly preferably from III-nitride semiconductor material.

"III-V" semiconductors include binary, ternary and quaternary alloys of Group III elements, such as Ga, Al and In, with Group V elements, such as N, P, As and Sb), and are of great interest for a number of applications, including optoelectronics.

Of particular interest is the class of semiconductor materials known as "III-nitride" materials, which includes gallium nitride (GaN), indium nitride (InN) and aluminium nitride (AlN), along with their ternary and quaternary alloys. III-nitride materials have not only achieved commercial success in solid-state lighting and power electronics, but also exhibit particular advantages for quantum light sources and light-matter interaction.

While a variety of III-nitride materials are commercially interesting, Gallium nitride (GaN) is widely regarded as one of the most important new semiconductor materials, and is of particular interest for a number of applications.

It is known that the introduction of pores into bulk GaN can profoundly affect its material properties, for example its refractive index. The possibility of tuning the optical properties of GaN by altering its porosity therefore makes porous GaN of great interest for optoelectronic applications.

The present invention will be described by reference to GaN but may advantageously be applicable to alternative III-nitride materials.

Prior publications relating to the porosification of III-V semiconductor material include international patent applications PCT/GB2017/052895 (published as WO2019/063957) and PCT/GB2019/050213 (published as WO2019/145728).

The inventors have found that multi-coloured LED devices and arrays of multi-coloured LED devices can advantageously be provided using the present invention.

Method of Manufacturing an LED Device

According to a first aspect of the present invention there is provided a method of manufacturing an LED device, comprising the steps of:

forming an n-doped connecting layer of III-nitride material over a porous region of III-nitride material;

forming a first electrically-insulating mask layer on the n-doped connecting layer; removing a portion of the first mask layer to expose a first exposed region of the n-doped connecting layer;

forming a first LED structure, which is configured to emit light at a first emission wavelength, on the first exposed region of the n-doped connecting layer;

forming a second electrically-insulating mask layer over the first LED structure and the n-doped connecting layer;

removing a portion of the second mask layer to expose a second exposed region of the n-doped connecting layer; and forming a second LED structure, which is configured to emit light at a second emission wavelength different from the first emission wavelength, on the second exposed region of the n-doped connecting layer.

By forming a first LED structure configured to emit light at a first emission wavelength, and a second LED structure configured to emit light at a second emission wavelength, on the n-doped connecting layer, a multi-colour LED device is provided. Both first and second LED structures emit at different wavelengths, though they are provided on the same porous template.

The first LED structure and the second LED structure may be configured to emit light at a variety of wavelengths. For example, the first LED structure may be a green-emission LED structure, or a blue-emission LED structure, or a red-emission LED structure. The second LED structure may also be a green-emission LED structure, or a blue-emission LED structure, or a red-emission LED structure, but is configured to emit at a different colour than the first LED structure.

In preferred embodiments, the first LED structure is configured to emit light at a first emission wavelength of between 515 nm and 540 nm, preferably around 530 nm, when the LED structure is under electrical bias, and the second LED structure is configured to emit light at a second emission wavelength of between 570 nm and 630 nm, preferably a wavelength greater than 600 nm, when the LED structure is under electrical bias.

The LED device is preferably a laminar structure formed from a stack of flat layers of semiconductor material. The thicknesses, compositions and charge carrier concentrations in each layer of the structure may be controlled during epitaxial deposition of each layer or region of the structure. As the device is formed by sequential deposition of layers, subsequent layers are deposited over the top of earlier layers, so that they are positioned above the earlier layers in the resulting structure. Such devices are typically deposited as very thin layers on flat substrates, such that the lateral width of the layers are far greater than their height. By controlling the order in which layers are deposited, and controlling the lateral size and position of each layer relative to the layers below, the relative positions of the device components may be controlled. Except where indicated otherwise, a layer or region described herein as being formed or positioned "over" or "above" another layer is located both vertically above the other layer in the semiconductor structure, and extends laterally over an area which corresponds to an area of at least a portion of the other layer in the structure below.

The n-type connecting layer advantageously acts as a current spreading layer to provide current to both the first and second LED structures. Providing multiple LED structures in contact with the same conductive connecting layer also means that electrical n-contact can be made very easily with both LED structures.

Forming an electrically-insulating (dielectric) mask layer, and then removing a portion of the mask to expose an exposed region of the n-doped connecting layer, creates a template or "footprint" on which the LED structures may be formed. The size and shape of the exposed regions may be controlled by controlling the size and shape of the portion of the mask that is removed. Subsequent layers of semiconductor material may then be deposited onto the first and second exposed regions to form the first and second LED structures respectively. By controlling the size and shape of the exposed regions, the lateral size (length and width) and shape of the subsequently-formed LED structures may be controlled. This size control is particularly advantageous for growing micro-LED structures with extremely small lateral dimensions.

In the prior art, large-scale LED structures are grown and then divided into micro-LEDs by etching channels to cut the structure into micro-scale platforms or "mesas" of the desired lateral size. In micro-LEDs made with such prior art techniques, etching damage to the sidewalls of the LED structure can have a significant effect on the tiny pixels formed by micro-LEDs. This can harm the reliability and brightness of the micro-LEDs.

The method of the present invention advantageously means that the first and second LED structures are formed in pre-defined exposed regions, optionally with the correct size and shape to form micro-LEDs. As the exposed regions in the present invention controls the footprint of the respective LED structures, the first and second LED structures may advantageously be formed to an appropriate size in the first place, so there is no need to etch the LED structure of the present invention to reduce its lateral size. The resulting LED device therefore avoids any of the dry etching damage that occurs in prior art methods.

Avoiding dry-etching damage to the active layers of the LED structures results in significant benefits compared to micro-LEDs prepared using prior art techniques, so that LED devices made using the present method are advantageously more reliable and brighter.

Another benefit of the present invention is that it is straightforward to make an electrical n-contact with the n-doped portion of the LED structures, even for very small micro-LED structures of only a few microns in size. The present invention allows an n-contact to be made simply by removing a further portion of the electrically-insulating mask layer to expose a second exposed region on the n-doped connecting layer, and depositing a conductive contact on the second exposed region.

The n-doped connecting layer of III-nitride material is formed over a porous region of III-nitride material. Preferably at least one of the LED structures is formed on the connecting layer of III-nitride material so that is it positioned over the porous region of III-nitride material.

In certain preferred embodiments, the porous region may be a continuous region covering a substrate, such that the porous region underlies the entire connecting layer, and all LED structures are formed over a porous region. Preferably, both the first LED structure and the second LED structure may be positioned over the porous region.

In other embodiments, the n-doped connecting layer of III-nitride material may be formed over a plurality of porous regions of III-nitride material, for example a plurality of regions having different porosities, arranged in the same plane. The different porous regions may occupy different lateral positions on the substrate, so that different LED structures may be positioned over different porous regions. For example, the first LED structure may be formed over a first porous region having a first porosity, and the second LED structure may be formed over a second porous region having a second porosity.

In other preferred embodiments, the n-doped connecting layer of III-nitride material may be formed over a porous region of III-nitride material and a non-porous region of III-nitride material. The porous region and the non-porous region may preferably be disposed in the same plane on a substrate, for example a layer of the structure may be made up partially of porous III-nitride material, and partially of non-porous material. Thus the porous region may underlie only a portion of the n-doped connecting layer, while the non-porous region underlies another portion of the n-doped connecting layer. In this embodiment, one of the first LED structure and the second LED structure may be positioned over the porous region, while the other is positioned over the non-porous region.

The present inventors have realised that electrochemical porosification of III-nitride materials advantageously leads to a reduction in the strain in the III-nitride lattice, and a reduction in the overall wafer bow or curvature. Without wishing to be bound by theory, it is thought that the process of porosifying the porous region of III-nitride material also etches away structural defects, such as threading dislocations which were formed during growth of that layer on top of the layer of first III-nitride material.

The removal of dislocations from the semiconductor material of the porous region during porosification greatly reduces the strain in the porous region, which occurs particularly if the lattice dimension of the porous region does not match the lattice dimension of the underlying material. Thus, during epitaxial growth of the semiconductor structure when layers of III-nitride material are deposited above the porous region, the porous material is more compliant to matching the lattice of the overlying non-porous layers. This results in the layers above the porous region experiencing significantly lower strain than would be the case without the porous region.

Composition pulling effect: Kawaguchi et al. reported a so-called InGaN composition pulling effect in which the indium fraction is smaller during the initial stages of growth but increases with increasing growth thickness. This observation was to a first extent independent of the underlying layer, GaN or AlGaN. The authors suggested that this effect is caused by strain caused by the lattice mismatch at the interface. They found that a larger lattice mismatch between InGaN and the bottom epitaxial layers was accompanied by a larger change in the In content.

In *Theoretical study of the composition pulling effect in InGaN metalorganic vapor-phase epitaxy growth* by Inatomi et al (Japanese Journal of Applied Physics, Volume 56, Number 7) it was found that compressive strain suppresses the incorporation of InN. On the other hand, tensile strain promotes the incorporation of InN compared to the relaxed bulk growth case.

The inventors have found that the use of a porous region in the semiconductor structure leads to "strain relaxation" which reduces strain in the layers of a semiconductor structure, and that this can lead to an improvement with respect to the composition pulling effect. Porosification reduces the strain in the III-nitride layers and the semiconductor structure is made less strained, and thus the conditions for higher incorporation of In are made available. The present invention can therefore aid in higher Indium incorporation into layers of any LED structure grown over the porous region, which is highly desirable for emission at longer wavelengths.

By providing a porous region of III-nitride material in the LED, one or more of the LED structures may therefore be grown over the porous region with a lower strain than would be possible without the porous region. This reduced level of strain in the layered semiconductor structure can therefore aid in higher Indium incorporation into the light emitting layer(s) of the LED, so that high quality InGaN light emitting layers can be grown with a high Indium content. This allows enough indium to be incorporated into the light-emitting indium gallium nitride layer so that the LED emits light at a peak wavelength between 600 and 750 nm when an electrical bias is applied across the LED.

There is a huge demand for red LEDs that emit light between 600 and 750 nm, the technical difficulties of incorporating enough indium into the light emitting layer(s) has meant red InGaN LEDs have been hard to achieve. Shorter-wavelength LEDs such as green (500-550 nm) and yellow (550-600 nm) LEDs, however, are much easier to manufacture, as they can be made using InGaN light emitting regions containing a lower proportion of Indium than is needed for red light emission.

The inventors have found that growing an LED structure over a porous region of III-nitride material causes a significant shift in emission wavelength towards longer wavelengths, compared to an identical LED structure grown on a non-porous substrate.

The inventors have demonstrated this by growing a conventional green/yellow (emission between 500-550 nm, or 550 nm-600 nm) InGaN LED structure on a non-porous GaN wafer, and demonstrating that the LED emits green/yellow light as expected. The same "green/yellow" InGaN LED structure was then grown on a template containing a porous region, and when an electrical bias was applied across the LED the LED emitted light in the red range of between 600 and 750 nm.

In a preferred embodiment, the present invention may comprise a first LED structure green/yellow (emission between 500-550 nm, or 550 nm-600 nm) InGaN LED structure formed on the connecting layer over the porous region, and a second LED structure green/yellow (emission between 500-550 nm, or 550 nm-600 nm) InGaN LED structure formed on the connecting layer over a non-porous region. The first LED structure and the second LED structure may have identical structures and compositions. Nevertheless, the position of the first LED structure over the porous region will shift the emission wavelength of the first LED structure so that it emits light at a different wavelength than the second LED structure. The second LED structure may emit light at green/yellow wavelengths (emission between 500-550 nm, or 550 nm-600 nm) as expected, while the first LED structure emits light at a longer wavelength of 600-650 nm. Multiple colours of emission may therefore be achieved simply by forming the same conventional LED structure twice—once over a non-porous region, and once over a porous region.

The steps of forming the first LED structure and the second LED structure may comprise growing LED structures according to conventional methods in the art. That is, the LED structures may be grown using known semiconductor deposition techniques and may have a variety of conventional LED epitaxial layers. While exemplary LED structures will be described herein by way of example, a large variety of LED structures (including various combinations of layer thicknesses, materials and doping levels) are known in the art and will be understood by the skilled person to be usable with the present invention. In the present invention, however, the first and second LED structures are respectively formed, grown or deposited only on the first and second exposed region(s) of the n-doped connecting layer.

The step of forming the first LED structure preferably comprises forming, on the first exposed region of the n-doped connecting layer:

a first n-doped portion;

a first p-doped portion; and a first light emitting region located between the first n-doped portion and the first p-doped portion.

The step of forming the second LED structure may comprise forming, on the second exposed region of the n-doped connecting layer:

a second n-doped portion;

a second p-doped portion; and a second light emitting region located between the second n-doped portion and the second p-doped portion.

The method of manufacturing an LED device may comprise a first step of electrochemically porosifying a layer of III-nitride material, to form the porous region of III-nitride material. This may be achieved using a wafer scale porosification process as set out in international patent applications PCT/GB2017/052895 (published as WO2019/063957) and PCT/GB2019/050213 (published as WO2019/145728). This step should be carried out prior to forming the n-doped connecting layer of III-nitride material over the porous region, so that the connecting layer is not also electrochemically porosified.

The method may preferably comprise the step of forming the porous region of III-nitride material by electrochemical porosification through a non-porous layer of III-nitride material, such that the non-porous layer of III-nitride material forms a non-porous intermediate layer. The non-porous intermediate layer may advantageously provide a smooth surface for overgrowth of the connecting layer, following which the intermediate layer is positioned between the porous region and the n-doped III-nitride connecting layer.

The porous region may be formed by porosifying one or more layers or regions of III-nitride material on a substrate. In order for the III-nitride material to be porosifiable, the material to be porosified should be n-type doped and have a doping concentration in the range of $1 \times 10^{17}$ to $1 \times 10^{20}$.

The substrate may be Silicon, Sapphire, SiC, β-Ga2O3. The crystal orientation of the substrates can be polar, semi-polar or non-polar orientation. The substrate thickness may typically vary between 100 μm and 1500 μm.

The porous region may be a porous layer, such that the method comprises the step of forming an n-doped connecting layer of III-nitride material over a porous layer of III-nitride material. Preferably the porous region may be a porous layer that is uniformly porous, for example formed from a continuous layer of porous III-nitride material.

The porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region. The n-doped connecting layer of III-nitride material may be formed over a porous region comprising a stack of porous layers of III-nitride material.

Alternatively the porous region may be a layer of III-nitride material that contains one or more porous regions, for example one or more porous regions in an otherwise non-porous layer of III-nitride material.

In preferred embodiments, the porous region, or porous layer, may have a lateral dimension (width or length) equivalent to that of the substrate on which the porous layer or region is grown. For example, conventional substrate wafer sizes may have a variety of sizes, such as 1 cm², or 2 inch, 4 inch, 6 inch, 8 inch, 12 inch, or 16 inch diameter. By patterning one or more layers and/or depositing regions of different charge carrier concentrations in the same layer, however, smaller porous regions can be formed that do not span the entire substrate. The lateral dimensions of the porous layer or region may therefore vary from around 1/10 of a pixel (for example 0.1 μm), up to the lateral dimensions of the substrate itself.

A layer, or a stack of layers, of n-doped III-nitride semiconductor material is grown on the substrate. The III-nitride layer may contain one or a combination of these elements: Al, Ga, In (ternary of quaternary layer). The thickness of the III-nitride stack is preferably between 10-4000 nm. The III-nitride layer to be porosified may have a doping concentration between $1\times10^{17}$ cm$^{-3}$-$5\times10^{20}$ cm$^{-3}$.

Preferably an intermediate layer of undoped III-nitride material is deposited over the doped material before it is porosified. The intermediate layer preferably have a thickness of between 1 nm and 3000 nm, preferably between 5 nm and 2000 nm, or between 1000 nm and 1500 nm.

As is known in the art, electrochemical porosification removes material from n-type doped regions of III-nitride materials, and creates empty pores in the semiconductor material.

In preferred embodiments, prior to porosification the doped region consists of an alternating stack of layers that are in a sequence of highly-doped layer/low-doped layer. The stack may consist of high/low doping layer pairs, preferably wherein the stack contains between 2-50 pairs of layers. The thickness of each highly-doped layer may vary between 10 nm and 200 nm, or between 20 nm and 150 nm, or between 50 nm and 100 nm. Low-doped layers may have a thickness of between 5 nm and 180 nm, or between 20 nm and 150 nm, or between 50 nm and 100 nm.

The stack of porous layers may preferably be a stack of alternating porous and non-porous layers. Preferably the stack comprises between 2 and 50 pairs of porous and non-porous layers, stacked one on top of another. The porous layers may preferably have a thickness of between 2 nm and 200 nm, or between 10 nm and 150 nm, or between 20 nm and 100 nm. The non-porous layers may preferably have a thickness of between 2 nm and 180 nm, or between 10 nm and 150 nm, or between 50 nm and 100 nm.

In preferred embodiments, the n-doped connecting layer of III-nitride material is formed over a stack of multiple porous layers of III-nitride material. Thus, rather than being a single porous layer of III-nitride material, the porous region may be a stack of layers of III-nitride material in which at least some layers are porous.

The porous region, or each porous layer in the porous region, may have a porosity of between 1% and 99% porous. Preferably the porous region, or each porous layer in the stack, has a porosity of between 10% and 90% porosity, or between 10% and 70% porosity.

The n-doped connecting layer of III-nitride material is grown over the region, preferably by deposition onto a non-porous intermediate layer.

The thickness of the non-porous intermediate layer may optionally be reduced by etching prior to the growth of the n-doped connecting layer of III-nitride material.

The n-doped connecting layer of III-nitride material preferably has a thickness of between 200 nm and 2000 nm. The n-doped connecting layer of III-nitride material may preferably have an n-type charge carrier concentration between $1\times10^{17}$ cm$^{-3}$-$5\times10^{20}$ cm$^{-3}$, preferably a charge carrier concentration of at least $1\times10^{18}$ cm$^{-3}$.

The first mask layer may be termed a first passivation layer. The first mask layer is preferably formed by depositing a layer of dielectric material over the n-doped connecting layer of III-nitride material. Preferably the first mask layer is deposited over the entire surface of the n-doped connecting layer of III-nitride material, so that the connecting layer is completely covered in dielectric material. The mask layer can be formed from SiO₂, SiN, SiON, Al₂O₃ or any other suitable dielectric material.

The first mask layer may have a thickness of between 20 nm and 1000 nm, preferably between 100 nm and 800 nm, particularly preferably between 200 nm and 600 nm.

The first mask layer may be deposited by conventional deposition techniques such as plasma-enhanced chemical vapor deposition (PECVD), sputtering, atomic layer deposition (ALD), evaporation or in-situ metal organic chemical vapor deposition (MOCVD).

Standard lithographic techniques may be used to remove portions of the first mask layer, to create one or more openings in the non-conducting mask layer that expose first regions of the n-doped connecting layer below. The step of removing a portion of the first mask layer may involve photolithography, wet etching or dry etching, for example inductively coupled dry etching (ICP-RIE).

The lateral size (length and width of the opening through the mask layer) and shape of the exposed region(s) controls the lateral size and shape of the LED structure to be grown in the exposed region.

The exposed region(s) of the connecting layer may be formed into any desired shape, and may be controlled by patterning and lithographically removing portions of the mask layer. For example, the exposed regions may be circular, square, rectangular, hexagonal, or triangular in shape.

The size of the first exposed region may be between 0.2 μm and 100 μm, preferably between 1 μm and 30 μm, particularly preferably between 2 μm and 10 μm.

Particularly preferably the size of the exposed region should be the size of a micro-LED. For example, the exposed region(s) may have a width and/or length (or diameter, if the exposed region is circular) of between 0.05 μm and 100 μm, preferably between 0.05 μm and 30 μm, particularly preferably less than 10 μm, for example between 0.1 μm and 10 μm or between 0.5 μm and 10 μm. In preferred embodiments the exposed regions may have a length, width or diameter of less than 50 μm, or less than 40 μm, or 30 μm, or 20 μm or 10 μm. Particularly preferably the exposed regions may have a width or diameter of less than 10 μm, so that the LED structures grown in the exposed regions form micro-LED pixels of less than 10 μm in size.

Once the first exposed region of the n-doped connecting layer has been formed in the dielectric mask layer, the first LED structure can be grown in the first exposed region, so that the first LED structures are in contact with the n-doped connecting layer.

The lateral dimensions of the first LED structure, including the n-doped portion, light-emitting region and p-doped portion, are preferably the same as that of the first exposed region, as the first LED structure is grown in the first exposed region and inherits its lateral size. This means that the first LED can be grown at an appropriate size without requiring an etching step to reduce the lateral dimensions of the LED structure.

Once the first LED structure has been formed, a second electrically-insulating mask layer is formed over the first LED structure and the n-doped connecting layer. The second electrically-insulating mask layer may be termed a second passivation layer. The second mask layer may be formed from one of: $SiO_2$, SiN, SiON, aluminium oxide, tantalum oxide, hafnium oxide, or a combination thereof. The second mask layer may be deposited by PECVD, sputtering, ALD, evaporation, in-situ MOCVD, or any other conventional technique.

The second mask layer covers the surfaces and sidewalls of the first LED structure as well as the connecting layer. The second mask layer may for example be $Al_2O_3$ (in a 10-100 nm thick layer) deposited by atomic layer depositions, and this may be followed by sputtered or plasma enhanced chemical vapor deposited $SiO_2$, SiN or SiON (in a 50-300 nm thick layer). The $Al_2O_3$ can be deposited between 50-150 C, while the $SiO_2$, SiN and SiON can be deposited between 250-350 C. The sputter process can be done at room temperature.

The thickness of the second mask layer may be between 20-2000 nm. The second mask layer may have a thickness of between 20 nm and 1800 nm, preferably between 200 nm and 1500 nm, particularly preferably between 500 nm and 1000 nm.

The first mask layer may be removed prior to deposition of the second mask layer. The first mask layer may be removed via wet etching using buffered oxide etching chemistry.

The step of removing a portion of the second mask layer to expose a second exposed region of the n-doped connecting layer may involve photolithography, wet etching or dry etching, for example inductively coupled dry etching (ICP-RIE).

The size of the second exposed region may be between 0.2 μm and 100 μm, preferably between 1 μm and 50 μm, particularly preferably between 2 μm and 10 μm.

Particularly preferably the size of the second exposed region should be the size of a micro-LED. For example, the second exposed region(s) may have a width and/or length (or diameter, if the exposed region is circular) of between 0.05 μm and 100 μm, preferably between 0.05 μm and 30 μm, particularly preferably less than 10 μm, for example between 0.1 μm and 10 μm or between 0.5 μm and 10 μm.

In preferred embodiments the exposed regions may have a length, width or diameter of less than 50 μm, or less than 40 μm, or 30 μm, or 20 μm or 10 μm. Particularly preferably the exposed regions may have a width or diameter of less than 10 μm, so that the second LED structures grown in the exposed regions form micro-LED pixels of less than 10 μm in size.

Once the second exposed region of the n-doped connecting layer has been formed in the second dielectric mask layer, the second LED structure can be grown in the second exposed region, so that the second LED structures are in contact with the n-doped connecting layer.

A variety of first and second LED structures may be grown in the exposed regions while obtaining the benefit of the present invention. All such LED structures typically comprise an n-doped portion, a light-emitting region and a p-doped portion, and optionally further layers of semiconductor material that are typical in LED epitaxy.

The first and second, and optionally third, LED structures may be formed in any sequence.

Exemplary LED structures suitable for use as either the first or second LED structures in the present invention are described below. The following description is applicable to both the first LED structure and the second LED structure.

In a preferred embodiment, the n-doped portion of each LED structure is grown on the exposed region of the connecting layer, so that the n-doped portion is in direct contact with the n-doped connecting layer.

The n-doped portion may comprise an n-doped layer of III-nitride material. The n-doped layer may comprise a III-nitride layer containing indium, or a stack of thin III-nitride layers with or without indium, or a bulk layer or stack of III-nitride layers with a variation in atomic percentage of indium across the layer or stack. For example, the n-doped region may be a layer of n-GaN, or a layer of n-InGaN, or alternatively the n-doped region may be a stack of n-GaN/ n-InGaN alternating layers, or a stack of n-InGaN/n-InGaN alternating layers having different quantities of indium in alternating layers.

The Indium atomic percentage in the n-doped portion may vary between 0.5-25%. The total thickness of the n-doped portion may vary between 2 nm-200 nm, for example between 10 nm and 150 nm, or between 20 nm and 100 nm. If the n-doped portion comprises a stack of layers, then the thickness of each individual layer in the stack may preferably vary between 1 nm and 40 nm, or between 5 nm and 30 nm.

The n-doped portion may have an n-type doping concentration between $1 \times 10^{17}$ cm$^{-3}$-$5 \times 10^{20}$ cm$^{-3}$.

After growth of the n-type portions of the LED structure in the exposed regions, the light-emitting region of the LED is overgrown on the n-type portion.

The light-emitting region in the first and/or second LED structures may comprise one or more III-nitride light-emitting layers, preferably indium gallium nitride (InGaN) light-emitting layers. The light-emitting layer or each light-emitting layer preferably comprises a quantum well, or a nanostructured layer comprising quantum structures such as quantum dots, fragmented or discontinuous quantum wells.

The quantum wells and barriers are preferably grown in a temperature range of 600-800 C, according to known techniques. On completion of the growth of the first light emitting region, the QWs are preferably within +/−200 nm of the height of the first mask layer.

The light-emitting layer or each light-emitting layer preferably comprises a III-nitride material with an atomic indium content of between 10-40%. The indium content of the light-emitting layers may be selected at different levels depending on the emission wavelength that is desired for the first and second LED structures. In preferred embodiments the light-emitting layer may have an indium content of between 12-18%, preferably above 13%, or an indium content between 20-30%, preferably above 22%, or an indium content between 30-40%, preferably above 33%.

The first light emitting region of the first LED structure preferably contains a different atomic indium content from the second light emitting region of the second LED structure, with the result that the first and second LED structures emit light at different wavelengths.

In a preferred embodiment, the one or more light-emitting layers in the first LED structure may have the composition $In_xGa_{1-x}N$, in which $0.10 \leq x \leq 0.40$, preferably $0.18 \leq x \leq 0.30$, particularly preferably $0.22 \leq x \leq 0.30$. In certain embodiments the one or more light-emitting layers in the second LED structure may have this composition.

In a preferred embodiment, the target electroluminescence (EL) emission wavelength of the first LED structure under electrical bias thereacross may be between 500 nm-560 nm, preferably 515 nm-540 nm or 520 nm to 540 nm, preferably 530 nm.

In a preferred embodiment, the one or more light-emitting layers in the second LED structure may have the composition $In_yGa_{1-y}N$, in which $0.20 \leq y \leq 0.40$, preferably $0.26 \leq y \leq 0.40$, particularly preferably $0.30 \leq y \leq 0.40$. In certain embodiments the one or more light-emitting layers in the first LED structure may have this composition.

The target EL emission wavelength at which the second LED structure emits light under electrical bias thereacross may be between 560 nm and 650 nm, preferably between 600 nm and 650 nm, or more than 600 nm.

In certain embodiments, the first and second LED structures may have the same structures, and may contain light-emitting regions having the same compositions.

In preferred embodiments, each light-emitting region comprises one or more InGaN quantum wells, preferably between 1 and 7 quantum wells. The thickness of each quantum well layer may vary between 1.5-8 nm.

The quantum wells may or may not be capped with a thin (0.5-3 nm) III-nitride layer.

The III-nitride barrier layer may contain one or a combination of these elements: Al, Ga, In (ternary or quaternary layer).

The quantum wells and barriers of the light-emitting region are preferably grown in a temperature range of 600-800° C.

The LED structures may comprise a cap layer of III-nitride material between the quantum wells and the p-doped portion, preferably in which the cap layer is undoped and has a thickness of between 5 nm and 30 nm.

The p-doped portions of the first and second LED structures are overgrown above the light-emitting regions, and comprises a p-doped III-nitride layer and a p-doped aluminium gallium nitride layer positioned between the p-doped III-nitride layer and the light emitting region. The p-doped aluminium gallium nitride layer is an electron-blocking-layer (EBL) between the cap layer and the p-type layer, in which the electron-blocking-layer contains 5-25 at % aluminium, preferably in which the electron-blocking-layer has a thickness of between 10 nm and 100 nm, or between 20 nm and 50 nm.

The p-doped III-nitride layer preferably has a p-type doping concentration of between $5 \times 10^{18}$ cm$^{-3}$-$8 \times 10^{20}$ cm$^{-3}$. The p-doped III-nitride layer may contain In and Ga, and may be between 20-200 nm thick, preferably between 50-100 nm thick. The doping concentration may vary across this layer and can have a spike in doping levels in the last 10-30 nm of the layer. For activation of Mg acceptors, the structure may be annealed inside of MOCVD reactor or in an annealing oven. The annealing temperature may be in the range of 700-850 C in N2 or in N2/O2 ambient.

As both the EBL and the p-doped layer are p-type doped, these layers may be referred to as the p-doped region.

The method may comprise the further step of, after the second LED structure has been formed, removing a portion of the second mask to expose a region of the first LED structure; and forming an electrical contact in the exposed region of the first LED structure, preferably forming an electrical connection with the p-doped portion of the first LED structure. An electrical connection may also be formed with the p-doped portion of the second LED structure.

Portions of the passivation layer and the dielectric mask layer may be removed by wet etching, dry etching, or a combination of both. For wet etching, buffered oxide etch, diluted hydrofluoric acid, phosphoric acid or a mixture of these can be used.

Forming a p-doped portion electrical connection may comprise the step of depositing transparent conducting oxide (e.g ITO, ZnO on other compatible oxides) or metal layers on the p-type region of the first and second LED structures. The covering can be done with a single step or multiple steps. The metals can cover the p-type regions completely or partially. The metal may contain Ti, Pt, Pd, Rh, Ni, Au, Ag etc. The thickness of the complete metal stack can be between 200 nm and 2000 nm, or between 500 nm and 1000 nm.

The structuring can be done be using standard semiconductor processing methods that included resist coating, photolithography and lift off. This can be combined with dry or wet structuring so that the conducting metal layer fully or only partially covers the top surface of the p-doped regions.

The method preferably comprises the step of, after the electrical connection has been formed with the p-doped portion, exposing a region of the n-type connecting layer and forming an electrical contact with the n-type connecting layer. A region of the n-type connecting layer is preferably exposed by removing a portion of the second mask layer.

Standard photolithography techniques can be used to create openings in the second mask layer. The size of the openings can vary between 200 nm and 50000 nm. This distance between the openings can be between 500 nm-30000 nm. The openings are creating only in the areas of the device that do not have any LED structure. Dry etching may be used to etch the passivation layer using fluorine based gases.

Forming an n-doped portion electrical connection may comprise the step of depositing a metal contact on the exposed region of the n-type connecting layer, preferably by depositing metal in the opening created in the second mask layer. The covering can be done with a single step or multiple steps. The metal may contain Ti, Pt, Pd, Rh, Ni, Au, Ag etc. The thickness of the metal stack contact can be between 200 nm and 2000 nm for example, or between 500 nm and 1000 nm.

Third LED Structure

The method of the present invention may advantageously be used to provide an LED device with three different emission wavelengths, by forming a third LED structure on the n-doped connecting layer.

The third LED structure may be formed on the n-doped connecting layer so that it is positioned above the porous region, or alternatively the third LED structure may be positioned over a non-porous region underlying the connecting layer.

In one preferred embodiment, the third LED structure may be formed simultaneously with either the first LED structure or the second LED structure. Thus the third LED structure may have the same structure as either the first LED structure or the second LED structure.

In another preferred embodiment, after forming the second LED structure on the second exposed region of the connecting layer, the second LED structure may be passivated by covering it in a third mask layer of dielectric material. A portion of the third mask layer, and any underlying mask layers, may then be removed to expose a third exposed region of the n-doped connecting layer. A third LED structure, configured to emit light at a third wavelength different from the first and second wavelengths, may then be formed on the third exposed region.

The steps of making electrical contacts to all three LED structures may then be performed as described above.

The third LED structure may be an LED structure as described above, which is configured to emit wavelength at a different wavelength from the first and second LED structures. In a particularly preferred embodiment, the LED device may comprise one red-, one green- and one blue-emitting LED structure.

Preferred Embodiment

In a preferred embodiment, the present method of manufacturing an LED may comprise the following steps:

Step 1—A porous layer of III-nitride material is formed on a substrate by depositing a layers of GaN with an n-type charge carrier density of above $1 \times 10^{18}$ cm$^{-3}$, and using the porosification technique set out in international patent application no PCT/GB2017/052895.

Step 2—An n-type connecting layer of n-(Al,In)GaN (heavily doped n-type (Al,In)GaN, such as n-GaN, n-AlGaN, or n-InGaN) is overgrown on top of the porosified DBR.

Step 3—A first mask layer of dielectric material, for example SiO2, is deposited on the top surface of the n-GaN.

Step 4—The dielectric material is patterned by lithography, or nano imprint, or any other suitable technique, and sections of the first mask layer are then removed by wet chemical or dry etching process. Removing some of the dielectric layer exposes a first exposed region of the underlying n-GaN. The removed area of dielectric is preferably the shape and size of a micro-LED, for example 100 μm×100 μm or smaller.

Step 5—A first LED structure is formed in the first exposed region by depositing an n-doped region of n-(Al, In)GaN, and then overgrowing a Quantum Well (QW) active light emitting region (which can include multiple quantum wells) on the exposed section of n-(Al,In)GaN. The quantum wells could be InGaN, AlGaN, InN, InAlN, AlInGaN, while the quantum barrier surrounding the quantum well layer could be GaN, AlN, AlGaN, AlInGaN, InAlN. Quantum Wells, their structures, and their functions, are defined in international patent application no. PCT/GB2019/050213. The lateral dimensions of the QWs are the same as those of the exposed section of n-(Al,In)GaN. This means that the QW region is the size desired for a micro-LED.

Step 6—A layer of p-(Al,In)GaN (heavily doped p-type (Al,In)GaN) is deposited on the top of the Quantum Well region. The lateral dimensions of the layer of p-GaN are the same as those of the QW, and the same as the exposed section of n-GaN. The p-GaN, the QW region and the n-doped region therefore form a first LED structure with the lateral dimensions desired for a micro-LED.

Step 7—A second mask layer of dielectric material, for example SiO2, is deposited on top of the first layer of dielectric, so that the second layer of dielectric covers the edges, or sidewalls, of the QW and p-(Al, In)GaN layers. This second layer of dielectric material is the passivation layer for the first LED structure.

Step 8—The second mask layer is patterned by lithography, or nano imprint, or any other suitable technique, and sections of the second mask layer are then removed by wet chemical or dry etching process. Removing some of the second mask layer exposes a second exposed region of the underlying n-GaN connecting layer, without damaging the passivated first LED structure. The removed area of dielectric is preferably the shape and size of a micro-LED, for example 100 μm×100 μm or smaller. The second exposed region may be positioned adjacent to the first LED structure, for example.

Step 9—A second LED structure is grown on the second exposed region of the n-doped connecting layer of n-GaN. The second LED structure may have a layered structure similar to that described above for the first LED structure, but the second LED structure is configured to emit light at a different wavelength than the emission wavelength of the first LED structure.

Step 10—A section of the second mask layer is removed by wet chemical or dry etching processes to expose the p-(Al, In)GaN layer of the first LED structure.

Step 10—Electrical p-contacts are deposited on the exposed section of p-(Al,In)GaN of both the first LED structure and the second LED structure, so that the p-contact is in electrical contact with the p-(Al,In)GaN layers of the LED structures.

Step 11—In order to make electrical n-contacts with the n-doped connecting layer, one or more regions of the second mask layer are removed (from areas of the wafer that are not occupied by the first and second LED structures) to expose a region of the n-doped connecting layer. Electrical n-contacts are then made with the connecting layer by depositing metal contacts according to known techniques.

This method means that LED structures that emit at two different wavelengths are provided on the same substrate. Even more advantageously, the active QW and p-(Al,In)GaN layers of the two LED structures do not experience any etching damage at any point during the fabrication process. N-contact can also be made very easily to small LED structures, by positioning them on an n-type connecting layer.

Avoiding dry-etching damage to the active layers of the micro-LED results in significant benefits compared to micro-LEDs prepared using prior art techniques. In micro-LEDs made with prior art techniques, etching damage to the sidewalls of the p-GaN and QW layers can have a significant effect on the tiny pixels formed by micro-LEDs. This can harm the reliability and brightness of the micro-LEDs.

Micro-LEDs made using the present method are not exposed to plasma etching damage on the sidewalls of the LED stack, and so are advantageously more reliable and bright.

If desired, layers of the semiconductor structure may be porosified by electrochemical etching as set out in international patent applications PCT/GB2017/052895 (published as WO2019/063957) and PCT/GB2019/050213 (published as WO2019/145728).

The method set out above relates to a p-side light out LED configuration.

A similar method may be used to manufacture an n-side light out micro-LED by incorporating a "flip-chip" step and bonding the micro-LED to a silicon CMOS backplane.

SiO2 is only an example of a dielectric suitable for masking and passivation, but other dielectrics may alternatively be used.

The layers of semiconductor material may be deposited by epitaxial growth. The layers described may be formed by molecular beam epitaxy (MBE), metalorganic chemical vapour deposition (MOCVD) (also known as metalorganic vapour phase epitaxy (MOVPE)), hydride vapour phase epitaxy (HVPE), ammonothermal processes, or other conventional processes suitable for growing III-nitride materials.

Manufacturing an Array of Micro-LEDs

According to a second aspect of the present invention there is provided a method of manufacturing an array of LEDs, comprising the step of:

forming an n-doped connecting layer of III-nitride material over a porous region of III-nitride material;

forming a first electrically-insulating mask layer on the n-doped III-nitride layer; removing a portion of the first mask to expose a first array of exposed regions of the n-doped connecting layer;

forming a first LED structure, configured to emit light at a first emission wavelength, on each exposed region of the first array on the n-doped connecting layer;

forming a second electrically-insulating mask layer over the first LED structures and the n-doped connecting layer;

removing a portion of the second mask layer to expose a second array of exposed regions of the n-doped connecting layer; and forming a second LED structure, configured to emit light at a second emission wavelength different from the first emission wavelength, on each exposed region of the second array on the n-doped connecting layer.

The method of manufacturing an array of LEDs preferably comprises the method of the first aspect, in which a plurality of exposed regions of the n-doped connecting layer are formed, and a plurality of LED structures are formed in those exposed regions. By removing sections of the mask layers to expose arrays of exposed regions, the layout of the LED array may be designed to have the desired dimensions and density of pixels formed by the LEDs.

Preferably the LED structures may be micro-LED structures.

Preferably the first LED structures and/or the second LED structures are positioned over the porous region. In some embodiments the first LED structures may be positioned over the porous region while the second LED structures are positioned over a non-porous region, or vice versa.

The first array of exposed regions and the second array of exposed regions are preferably uniform arrangements or patterns of identical exposed regions. For example, the first and/or second array may comprise multiple rows and columns of regularly-spaced exposed regions.

As the method involves forming a first LED structure on each of the exposed regions of the first array of exposed regions, this involves forming a plurality of first LED structures. The step of forming a second LED structure on each of the exposed regions of the second array of exposed regions may be termed forming a plurality of second LED structures.

When exposing the first array of exposed regions and the second array of exposed regions, the distance between adjacent exposed regions may preferably be between 500 nm and 30000 nm, or between 750 nm and 20000 nm, or between 1000 nm and 15000 nm.

The array of LEDs may advantageously be formed on a single substrate. The plurality of first LED structures may be formed simultaneously, and the plurality of second LED structures may be formed simultaneously, using deposition steps which deposit layers of semiconductor material on each exposed region of the connecting layer at the same time.

The method may optionally include the step of forming a third electrically-insulating mask layer over the first and second LED structures and the n-doped connecting layer, removing a portion of the third mask layer to expose a third array of exposed regions of the n-doped connecting layer, and forming a third LED structure, configured to emit light at a third emission wavelength different from the first and second emission wavelengths, on each exposed region of the third array on the n-doped connecting layer.

Using this method, an array of differently coloured LEDs or micro-LEDs may be formed on the same wafer without requiring any etching step to cut the LED structures to the lateral dimensions desired for individual pixels. The micro-LEDs in the array therefore avoid any etching damage to the sidewalls of the LED structure.

The method of the second aspect may advantageously include any and all of the features described above in relation to the first aspect of the invention.

Method of Manufacturing a Three Colour LED Device

According to a third aspect of the present invention there is provided a method of manufacturing a three colour LED device, comprising the steps of:

forming an n-doped connecting layer of III-nitride material over a porous region of III-nitride material and a non-porous region of III-nitride material in the same plane as the porous region;

forming a first electrically-insulating mask layer on the n-doped connecting layer;

removing a portion of the first mask layer to expose a first exposed region of the n-doped connecting layer over (above) the porous region, removing a portion of the first mask layer to expose a second exposed region of the n-doped connecting layer over (above) the non-porous region;

forming a first LED structure, which is configured to emit light at a first emission wavelength, on the first exposed region of the n-doped connecting layer;

forming a second LED structure, which is configured to emit light at a second emission wavelength, on the second exposed region of the n-doped connecting layer;

forming a second electrically-insulating mask layer over the first LED structure, the second LED structure, and the n-doped connecting layer;

removing a portion of the second mask layer to expose a third exposed region of the n-doped connecting layer; and forming a third LED structure, which is configured to emit light at a third emission wavelength different from the first emission wavelength and the second emission wavelength, on the third exposed region of the n-doped connecting layer.

As the three LED structures emit light at three different emission wavelengths in response to electrical bias applied across the LED structures, the device is a three-colour LED device.

In a particularly preferred embodiment, the first, second and third emission wavelengths are red, green and blue. The three-colour LED device may therefore be a red-green-blue (RGB) LED device.

In a preferred embodiment, the second LED structure may be identical to the first LED structure, and the first and second LED structures are formed simultaneously. In this embodiment, the different first and second emission wavelengths of the first and second LED structures is caused by a wavelength shift created by the porous region that is underlying the first LED structure, but not the second LED structure. For example, both the first and second LED structures may be conventional green LED structures (that is, LED structures known to emit green light under an applied electrical bias). Due to the porous region causing a wavelength shift in the present invention, however, the first LED structure in the three-colour LED device may advantageously emit red light under an applied electrical bias, while the second LED structure emits green light as expected.

The third exposed region of the n-doped connecting layer is preferably over the non-porous region of III-nitride material. Thus the third LED structure is preferably grown over, or above, a non-porous region of the template, rather than over a porous region.

The third LED structure may be a conventional LED structure configured to emit light of a known wavelength under an applied electrical bias. Preferably, the third LED structure may be a blue LED. Particularly preferably, the third LED may be a blue LED formed by the process described in WO2019/145728. For example, the blue LED may be formed by electrochemically porosifying the light-emitting quantum well layers in the as-grown third LED structure. As described in WO2019/145728, porosifying the quantum well layers results in a blue-shift in the emission spectrum of the LED structure.

LED Device

Another aspect of the invention relates to an LED device, which may be a an LED device or a micro-LED device made by the method set out above.

According to a fourth aspect of the present invention there is provided an LED device, comprising:

an n-doped connecting layer of III-nitride material over a porous region of III-nitride material;

an electrically-insulating mask layer on the n-doped III-nitride layer;

a first LED structure, configured to emit light at a first emission wavelength, and a second LED structure, configured to emit light at a second emission wavelength different from the first emission wavelength, in which at least a portion of the first and second LED structures extend through a gap in the electrically-insulating mask layer, and are in contact with the n-doped connecting layer.

The LED device is preferably an LED device manufactured using the method described above in relation to the first aspect of the invention. The LED device comprises two LED structures that emit at different wavelengths, and so may be termed a multi-colour LED, a multi-colour LED device, or a multi-wavelength LED device.

As described above, the n-doped connecting layer of III-nitride material may extend over a continuous porous region of III-nitride material, or the connecting layer may extend over a porous region of III-nitride material and a non-porous region of III-nitride material, the porous region and non-porous region being disposed in the same plane as one another.

Preferably at least one of the first LED structure and the second LED structure is positioned over the porous region. In some embodiments both the first LED structure and the second LED structure are positioned over the porous region. In other embodiments, one of the first LED structure and the second LED structure is positioned over the porous region, and the other is positioned over the non-porous region. The porous region may be a porous layer, such that the LED device comprises an n-doped connecting layer of III-nitride material over a porous layer of III-nitride material. In some embodiments, the porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region. The n-doped connecting layer of III-nitride material may be formed over a porous region comprising a stack of porous layers of III-nitride material.

In preferred embodiments, the n-doped connecting layer of III-nitride material is positioned over a stack of multiple porous layers of III-nitride material. Thus, rather than being a single porous layer of III-nitride material, the porous region may be a stack of layers of III-nitride material in which at least some layers are porous.

The stack of porous layers may preferably be a stack of alternating porous and non-porous layers. Preferably the stack comprises between 5 and 50 pairs of porous and non-porous layers, stacked one on top of another. The porous layers may preferably have a thickness of between 10 nm and 200 nm, and the non-porous layers may preferably have a thickness of between 5 nm and 180 nm.

Preferably the porous region, or each porous layer in the stack, has a porosity of between 10% and 90% porosity, or between 20% and 70% porosity.

The LED device preferably comprises a non-porous intermediate layer of III-nitride material porous region between the porous region and the n-doped III-nitride connecting layer. As the porous region is preferably formed by electrochemical porosification through a non-porous layer of III-nitride material, using the method of PCT/GB2017/052895 (published as WO2019/063957) and PCT/GB2019/050213 (published as WO2019/145728), the non-porous layer of III-nitride material typically forms a non-porous intermediate layer which remains on top of the porous region. The non-porous intermediate layer may advantageously provide a smooth surface for overgrowth of the connecting layer during manufacture.

In a particularly preferred embodiment, the stack of porous layers comprises a porous Distributed Bragg Reflector (DBR) or optical filter, such that the n-doped connecting layer of III-nitride material is positioned over a porous DBR or optical filter of III-nitride material. A porous DBR or optical filter may be made up of a stack of alternating porous/non-porous layers, as the differing porosity between adjacent layers creates a difference in the refractive index of adjacent layers, hence the transmission and reflectance properties.

The LED device may comprise an intermediate layer of non-porous III-nitride material positioned between the porous region and the connecting layer. The intermediate layer preferably has a thickness of between 1 nm and 3000 nm, preferably between 20 nm and 2000 nm, or between 50 nm and 1000 nm.

The n-doped connecting layer of III-nitride material preferably has a thickness of between 100 nm and 2000 nm, or between 200 nm and 1000 nm. The n-doped connecting layer of III-nitride material may have a doping concentration between $1\times10^{17}$ cm$^{-3}$-$5\times10^{20}$ cm$^{-3}$ and preferably has an n-type charge carrier concentration of at least $1\times10^{18}$ cm$^{-3}$.

The mask layer preferably extends over the entire surface of the n-doped connecting layer of III-nitride material, so that apart from the first and second LED structures, the connecting layer is completely covered in dielectric material. The mask layer can be formed from SiO2, SiN, SiON, AlO$_x$ or any other suitable dielectric material.

The mask layer may have a thickness of between 20 nm and 2000 nm, preferably between 200 nm and 1500 nm, particularly preferably between 400 nm and 1000 nm.

The LED structures may have any desired shape, as the footprint of the LED structures may be controlled during manufacturing by patterning and lithographically removing portions of the mask layer. For example, the footprints of the LED structures (seen in plan-view) may be circular, square, rectangular, hexagonal, or triangular in shape.

The LED structures may have lateral dimensions that are classed as a "micro-LED". For example, the LED structures may have a width and/or length (or diameter, if the LED is circular) of between 0.05 μm and 100 μm, preferably between 0.05 μm and 30 μm, particularly preferably less than 10 μm, for example between 0.1 μm and 10 μm or between 0.5 μm and 10 μm. In preferred embodiments the LED structure may have a length, width or diameter of less than 50 μm, or less than 40 μm, or 30 μm, or 20 μm or 10 μm. Particularly preferably the LED structures may have a width or diameter of less than 10 μm, so that the LED structures form micro-LED pixels of less than 10 μm in size.

The first LED structure comprises:
a first n-doped portion;
a first p-doped portion; and
a first light emitting region located between the first n-doped portion and the first p-doped portion.

The second LED structure comprises:
a second n-doped portion;
a second p-doped portion; and
a second light emitting region located between the second n-doped portion and the second p-doped portion.

At least a portion of the first LED structure and the second LED structure preferably extends through the electrically-insulating dielectric mask layer, so that the LED structures are each in electrical contact with the n-doped connecting layer.

As explained above in relation to the first aspect of the invention, the LED structure may take a variety of different forms having layers of different thickness, composition and charge carrier concentration.

The features of the LED device described above in relation to the first aspect of the invention apply equally to the LED device of the third aspect.

The first and/or second LED structures may comprise an active layer which may be a Quantum Well, or a Quantum layer (for example a porosified Quantum Well containing a plurality of 3D quantum structures). The Quantum Well could be InGaN, AlGaN, InN, InAlN, AlInGaN, while the quantum barrier surrounding the quantum well layer could be GaN, AlN, AlGaN, AlInGaN, InAlN.

The LED structures may have lateral dimensions (Length and width) smaller than 100 μm×100 μm all the way down to a few tens of nanometers or even smaller. In this context, the "height" of the LED is the dimension in the direction of intended light emission.

The first light emitting region preferably comprises one or more light-emitting layers with the composition In$_x$Ga$_{1-x}$N, in which $0.10 \leq x \leq 0.40$, preferably $0.18 \leq x \leq 0.30$, particularly preferably $0.22 \leq x \leq 0.30$.

The second light emitting region preferably comprises one or more light-emitting layers with the composition In$_y$Ga$_{1-y}$N, in which $0.20 \leq y \leq 0.40$, preferably $0.26 \leq y \leq 0.40$, particularly preferably $0.30 \leq y \leq 0.40$.

The first and second light emitting regions preferably contain different atomic indium contents, and therefore have different emission wavelengths.

The light-emitting regions preferably comprise one or more InGaN quantum wells, particularly preferably between 1 and 7 quantum wells.

The LED device may optionally comprise further LED structures configured to emit light at wavelengths different from the first and second wavelengths. For example. The LED device may additionally comprise a third LED structure, a portion of which extends through a gap in the electrically-insulating mask layer, and is in contact with the n-doped connecting layer.

Array of LEDs

According to a fifth aspect of the present invention there is provided an array of LEDs. The array of LEDs may comprise a plurality of LED devices according to the fourth aspect of the invention, formed on a shared substrate, such as a single semiconductor wafer.

The invention may provide an array of LEDs, comprising:
an n-doped connecting layer of III-nitride material over a porous region of III-nitride material;
an electrically-insulating mask layer on the n-doped III-nitride layer;
a plurality of gaps in the electrically-insulating mask layer,
a plurality of first LED structures configured to emit light at a first emission wavelength, and
a plurality of second LED structures configured to emit light at a second emission wavelength,
in which at least a portion of each LED structure extends through a gap in the electrically-insulating mask layer, and is in contact with the n-doped connecting layer.

An array of LEDs is an ordered series or arrangement of LEDs, for example a regular formation of multiple rows and columns each containing a plurality of LEDs.

The array of LEDs may be an array of LEDs manufactured using the method of the second aspect of the invention.

Preferably the array is an array of micro-LEDs which emit light of two different colours due to the respective arrays of first and second LED structures.

The array of LEDs may additionally comprise a plurality of third LED structures configured to emit light at a third emission wavelength different from the first and second emission wavelengths.

Three-Colour LED Device

According to a sixth aspect of the present invention there is provided a three colour LED device, comprising:
an n-doped connecting layer of III-nitride material over a porous region of III-nitride material;
an electrically-insulating mask layer on the n-doped III-nitride layer;
a first LED structure, configured to emit light at a first emission wavelength, a second LED structure, configured to emit light at a second emission wavelength different from the first emission wavelength, and a third LED structure, configured to emit light at a third emission wavelength different from the first and second emission wavelengths, in which at least a portion of the first, second and LED structures are in contact with the n-doped connecting layer.

Particularly preferably, the three-colour LED device is a red-green-blue (RGB) LED device, and the first, second and third LED structures are configured to emit red, green and blue light under an applied electrical bias.

As described above, the n-doped connecting layer of III-nitride material may extend over a continuous porous region of III-nitride material, or the connecting layer may extend over a porous region of III-nitride material and a non-porous region of III-nitride material, the porous region and non-porous region being disposed in the same plane as one another.

Preferably at least one of the first LED structure, the second LED structure and the third LED structure is positioned over the porous region. In some embodiments both the first LED structure and the second LED structure are positioned over the porous region. In other embodiments, one of the first LED structure and the second LED structure is positioned over the porous region, and the other is positioned over the non-porous region.

The first LED structure is preferably positioned over the porous region of III-nitride material, and the second LED structure is preferably not positioned over the porous region of III-nitride material.

In some preferred embodiments, the second LED structure is identical to the first LED structure, and the first and second LED structures emit light at different emission wavelengths due to the porous region beneath the first LED structure.

In a preferred embodiment, the first LED structure may be an LED structure for emitting at a peak wavelength of 515-540 nm under an electrical bias applied across the LED structure. The porous region of III-nitride material under the first LED structure may then shift the emission wavelength of the first light-emitting region of the LED structure to between 600 and 650 nm. Thus the first LED structure may emit red light.

In a preferred embodiment, the second LED structure may also be an LED structure for emitting at a peak wavelength of 515-540 nm under an electrical bias applied across the LED structure. Preferably the second LED structure is not positioned over a porous region, so the second LED structure emits at the expected peak wavelength of 515-540 nm under an electrical bias. Thus the first LED structure may emit green light.

One or more light-emitting layers in the first LED structure and the second LED structure may have the composition $In_xGa_{1-x}N$, in which $0.10 \leq x \leq 0.40$, preferably $0.18 \leq x \leq 0.30$, particularly preferably $0.22 \leq x \leq 0.30$.

Preferably, the third LED structure is not positioned over the porous region of III-nitride material.

In particularly preferred embodiments the third LED structure may be configured to emit light at a peak wavelength between 415 and 500 nm under electrical bias thereacross, preferably between 430 and 470 nm under electrical bias thereacross.

One or more light-emitting layers in the third LED structure may have the composition $In_zGa_{1-z}N$, in which $0.10 \leq z \leq 0.30$, preferably $0.12 \leq z \leq 0.25$, particularly preferably $0.15 \leq z \leq 0.20$.

Particularly preferably, the third LED structure may comprise one or more porous light-emitting layers. As described in WO2019/145728, the porosity of the light-emitting layers may advantageously create additional quantum confinement that leads to a blue-shift in the emission wavelength of the third LED structure, such that the third LED structure emits blue light when an electrical bias is applied across the structure.

In a particularly preferred embodiment, the first, second and third LED structures are configured so that:

the first LED structure emits light at a peak wavelength between 560 nm and 750 nm, preferably between 600 and 650 nm, under electrical bias thereacross;

the second LED structure emits light at a peak wavelength between 500 nm and 560 nm, preferably between 515 and 550 nm, under electrical bias thereacross; and the third LED structures emits light at a peak wavelength between 400 and 500 nm, preferably between 430 nm and 470 nm under electrical bias thereacross.

All of the features described above in relation to any of the first, second, third, fourth, fifth or sixth aspects of the invention are equally applicable to the other aspects of the invention.

BRIEF DESCRIPTION OF THE DRAWINGS

Specific embodiments of the invention will now be described with reference to the figures, in which:

FIGS. 2-22 are schematic side-on cross-sections illustrating the steps of manufacturing an array of five micro-LEDs according to a preferred embodiment of the present invention;

FIGS. 23-44 are schematic side-on cross-sections illustrating the steps of manufacturing a red-green-blue LED device according to a preferred embodiment of the present invention;

FIG. 1 illustrates a porous template suitable for an LED device according to the present invention.

The porous template comprises a porous region of III-nitride material on a substrate, with a non-porous layer of III-nitride material arranged over the top surface of the porous region. Optionally there may be further layers of III-nitride material between the substrate and the porous region.

As described in more detail above, the porous region may be provided by epitaxially growing an n-doped region of III-nitride material and then an undoped layer of III-nitride material, and porosifying the n-doped region using the porosification process as set out in international patent applications PCT/GB2017/052895 (published as WO2019/063957) and PCT/GB2019/050213 (published as WO2019/145728).

The porous region may comprise one or more layers one or more III-nitride materials, and may have a range of thicknesses. In preferred embodiments, the porous region may for example comprise GaN and/or InGaN and or AlGaN.

In a preferred embodiment, micro-LEDs according to the present invention comprise the following layers, and may be manufactured using the step by step process described below.

The following description of the LED structure of the micro-LED relates to a Top emission architecture being described from the bottom up, but the invention is equally applicable to a bottom emission architecture.

Figure 1:
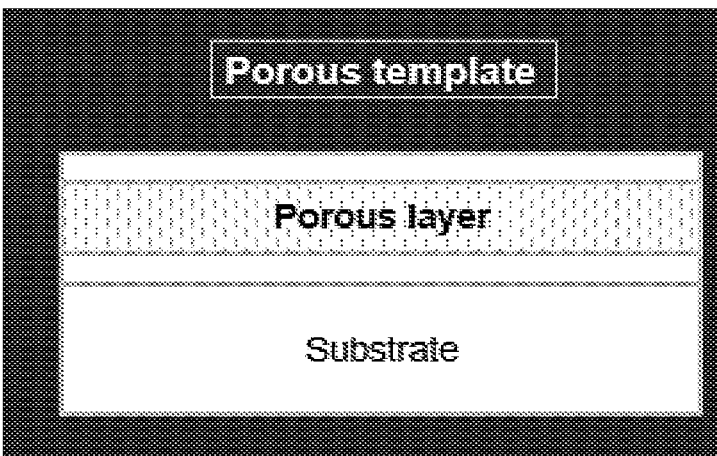
FIG. 1 illustrates a porous template suitable for an LED device, or an array of micro-LEDs, according to the present invention.
Figure 2:
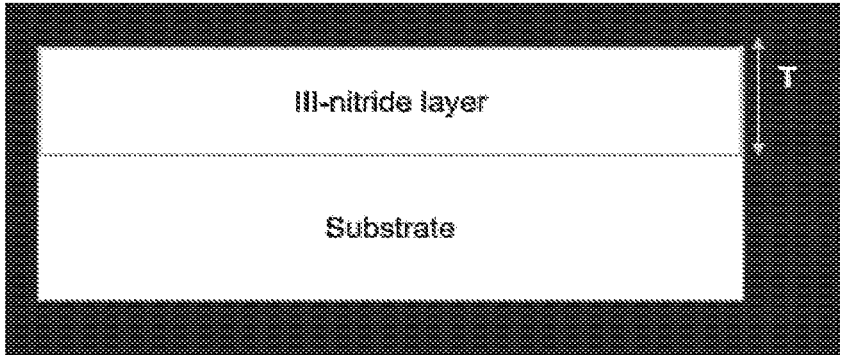

FIG. 2—Substrate & III-Nitride Layer for Porosification

A compatible substrate is used as a starting surface for epitaxy growth. The substrate may be Silicon, Sapphire, SiC, β-Ga2O3, GaN, glass or metal. The crystal orientation of the substrates can be polar, semi-polar or non-polar orientation. The substrate size may vary from 1 cm$^2$, 2 inch, 4 inch, 6 inch, 8 inch, 12 inch, 16 inch diameters and beyond, and the substrate may have a thickness of greater than 1 μm, for example between 1 μm and 15000 μm. Preferably the substrate is a semiconductor wafer. An advantage of the present invention is that an array of micro-LEDs may be manufactured simultaneously on a fully sized semiconductor wafer. While the illustrated example shows two micro-LEDs being formed on a shared template, the same method may be used to manufacture arrays of many micro-LEDs simultaneously on the same wafer.

A layer or stack of layers of III-nitride material is epitaxially grown on the substrate. The III-nitride layer may contain one or a combination of these elements: Al, Ga, In (binary, ternary or quaternary layer).

The thickness T of the III-nitride layer to be porosified is preferably at least 1 nm, 5 nm, 10 nm, or at least 50 nm, or at least 100 nm, for example between 10-10000 nm, preferably between 10 nm and 4000 nm.

The III-nitride layer to be porosified comprises a doped region having an n-type doping concentration between $1 \times 10^{17}$ cm$^{-3}$-$5 \times 10^{20}$ cm$^{-3}$. The III-nitride layer may also comprise an undoped layer (not shown) of III-nitride material over the doped region.

The doped region may terminate at the exposed upper surface of the III-nitride layer, in which case the surface of the layer will be porosified during electrochemical etching.

Preferably, the doped region of the III-nitride material is covered by an undoped intermediate (or "cap") layer of III-nitride material, so that the doped region is sub-surface in the semiconductor structure. The sub-surface starting depth (d) of the doped region may be between 1 nm and 3000 nm for example, or between 5 nm and 2000 nm.

In the example illustrated in FIGS. 2 to 22, the III-nitride layer is porosified by known electrochemical porosification techniques to form a single uniformly-porous layer of III-nitride material.

Figure 3:
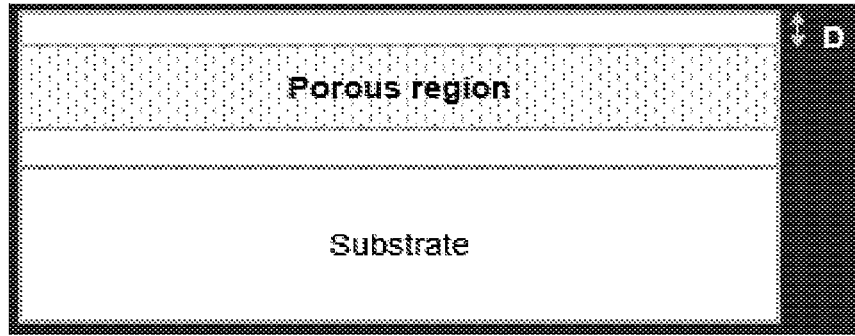

FIG. 3—Porous Region

After it is deposited on the substrate, the n-doped III-nitride layer is porosified with a wafer scale porosification process as set out in international patent applications PCT/GB2017/052895 (published as WO2019/063957) and PCT/GB2019/050213 (published as WO2019/145728). During this process, the n-doped III-nitride material become porous, while any undoped region of III-nitride material does not become porous. The degree is porosity of the porous layers is controlled by the electrochemical etching process and may preferably be between 10%-90%, preferably between 20% and 70%.

Following the porosification step, the structure contains a non-porous intermediate layer overlying a porous layer.

Figures 4, 5, 6, 7:
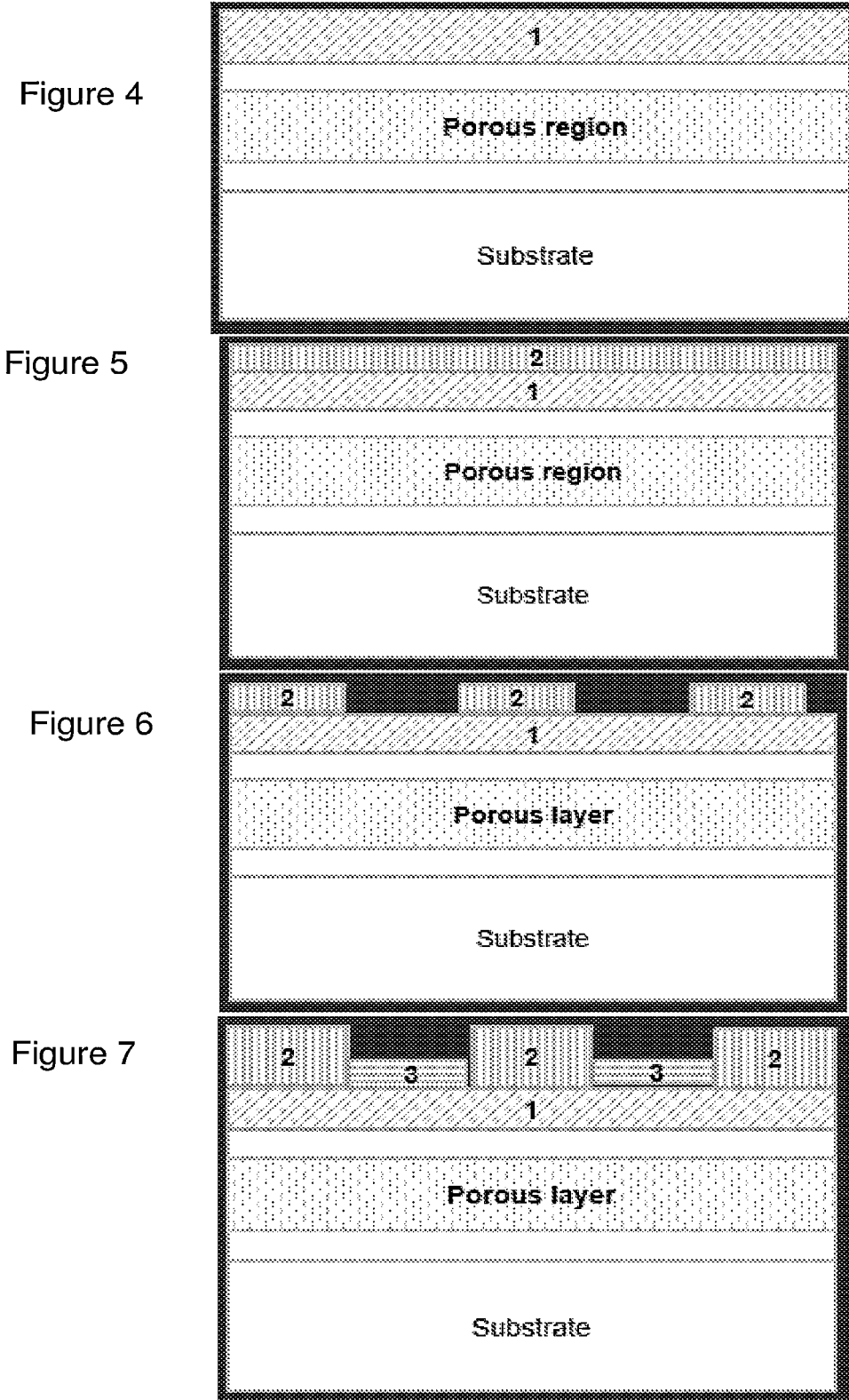

FIG. 4—Connecting Layer

As shown in FIG. 3, after porosification, the wafer is overgrown with a connecting layer 1. The connecting layer is a n-doped III-nitride (preferably GaN) layer with a thickness of between 100 and 2000 nm (layer 1 in FIG. 3), and an n-type charge carrier concentration of between $1 \times 10^{17}$ cm$^{-3}$-$5 \times 10^{20}$ cm$^{-3}$ and preferably $>1 \times 10^{18}$ cm$^{-3}$.

The connecting layer 1 is formed of III-nitride material and may contain one or a combination of these elements: Al, Ga, In (binary, ternary or quaternary layer). The connecting layer is doped with suitable n-type dopant materials, e.g Si, Ge, C, O.

FIG. 5—First Mask Layer

An electrically-insulating first mask layer 2 is then deposited on the wafer surface, to cover the connecting layer 1. The purpose of the mask layer 2 is to protect certain regions of the wafer in the next steps as a mask and to enable selective area epitaxy on top of this template.

This mask layer 2 can be SiO2, SiN, SiON, AlO$_x$ or any other suitable layer. The thickness of this layer can be between 20 nm and 1000 nm, preferably between 100 nm and 700 nm.

The method used for deposition of this layer can be PECVD, sputtering, ALD, evaporation or an in-situ MOCVD approach.

FIG. 6—First Exposed Regions of the Connecting Layer

Standard lithographic or photolithographic techniques are used to create openings in the non-conducting first mask layer 2, to reveal first exposed regions on the surface of the connecting layer. The openings can be created either with a wet etching or a dry etching method.

In the schematic illustrations of the Figures, two first exposed regions are formed through the first mask layer 2. In a preferred embodiment, a regular array of a plurality of first exposed regions are formed across a masked semiconductor wafer.

In a particularly preferred example inductively coupled dry etching (ICP-RIE) is used to remove SiO$_2$ from two areas, which creates two exposed regions on the surface of the connecting layer 1 that are no longer covered by the first mask layer 2.

The size of the first exposed regions may be between 200 nm and 50000 nm, preferably between 500 nm and 10000 nm, or between 1000 nm and 8000 nm.

The distance between adjacent first exposed regions is preferably greater than the lateral width of the first exposed regions, preferably at least 1.5×, or at least 2× greater than the lateral width of the first exposed regions. The distance between adjacent first exposed regions may be selected so that there is space for a further LED structure to be grown in between adjacent first exposed regions.

The distance between the two first exposed regions may be between 500 nm and 30000 nm, for example between 1000 nm and 10000 nm or between 5000 nm and 8000 nm.

The shape of the exposed regions can be circular, square, rectangular, hexagonal, triangular etc. The width or diameter of the openings are preferably less than 100 μm so that the LED structures formed on the exposed areas are classed as micro-LEDs. The exposed regions may preferably have a width of 0.05 μm-30 μm, particularly preferably of 10 μm or less.

First LED structures are subsequently grown in all of the first exposed regions of the connecting layer 1, so that these exposed regions become µLED pixels.

FIG. 7—First N-Doped Region

After the first exposed regions of the connecting layer 1 are formed, an n-doped layer 3 of III-nitride material is deposited in the first exposed regions.

In the particular example shown, an n-doped layer 3 is grown by MOCVD. The growth takes place only inside the first exposed regions, on the surface of the n-doped connecting layer 1. Si is used as a dopant in the n-doped layer 3, with a doping concentration of at least >$1 \times 10^{19}$ cm$^{-3}$.

The n-doped layer 3 may be a bulk III-nitride layer containing Indium or a stack of thin III-nitride layers with or without indium, or with a variation in atomic percentage of indium across the bulk layer or the stack. The Indium atomic percentage may vary between 0.5-25%. The total thickness of the n-type layer 3 may vary between 2 nm and 200 nm, for example between 50 nm and 100 nm. If the stack is used then the thickness of individual layer in the stack may vary between 1-40 nm. The n-doped layer 3 may have an n-doping concentration of between $1 \times 10^{17}$ cm$^{-3}$-$5 \times 10^{20}$ cm$^{-3}$.

Figure 8:
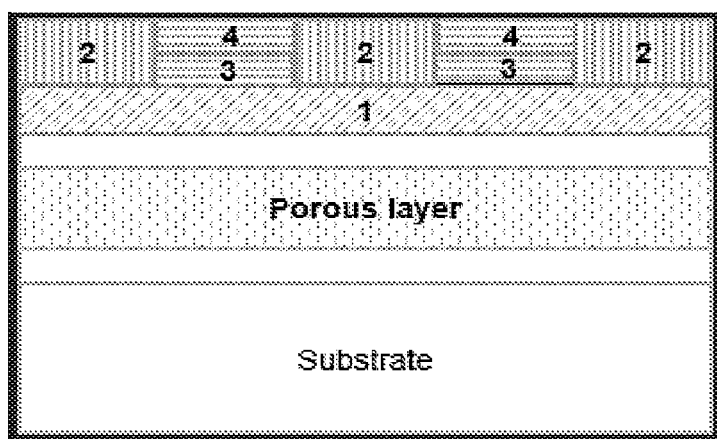

FIG. 8—First Light Emitting Region

After growth of the first n-type layer 3 in the first exposed regions, first light-emitting regions 4 are grown.

The first light-emitting region 4 may contain at least one light emitting layer. Each light emitting layer may be a quantum well (QW), preferably an InGaN quantum well (QW). Preferably the light emitting region may comprise between 1-7 quantum wells. Adjacent quantum wells are separated by barrier layers of III-nitride material having a different composition to the quantum wells.

The light emitting layer(s) may be referred to as "quantum wells" throughout the present document, but may take a variety of forms. For example, the light emitting layers may be continuous layers of InGaN, or the layers may be continuous, fragmented, broken layers, contain gaps, or nanostructured so that the quantum well effectively contains a plurality of 3D nanostructures behaving as quantum dots.

The quantum wells and barriers are grown in a temperature range of 600-800° C.

Each quantum well preferably consists of an InGaN layer with atomic indium percentage between 18-30%, preferably above 22%, and preferably below 30%.

The thickness of each quantum well layer may be between 1.5-8 nm, preferably between 1.5 nm and 6 nm, or between 1.5 nm and 4 nm.

The quantum wells may or may not be capped with a thin (0.5-3 nm) III-nitride QW capping layer, which may contain one or a combination of these elements: Al, Ga, In (ternary of quaternary layer).

The QW capping layer, which (if present) is the layer added immediately after QW growth, can be AlN, AlGaN of any Al % 0.01-99.9%, GaN, InGaN of any In % 0.01-30%.

The III-nitride QW barriers separating the light emitting layers (quantum wells) may contain one or a combination of these elements: Al, Ga, In (ternary of quaternary layer).

The QW capping layer(s) and QW barriers are not indicated with individual reference numerals in the Figures, as these layers form part of the light emitting region 4.

On completion of growth the height of the light emitting region 4 is within +1-200 nm of the height of the first mask layer 2.

The target emission wavelength of the light emitting region 4 is between 515 nm-540 nm, preferably 530 nm.

Figure 9:
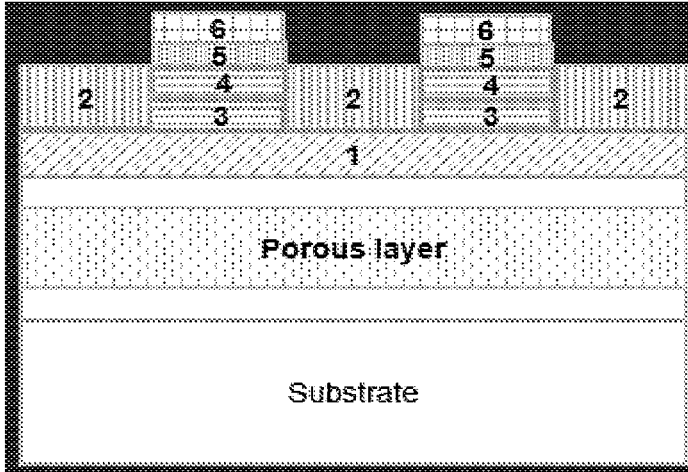

FIG. 9—Capped Layer and EBL

After growth of quantum wells a non-doped cap layer 5 is grown. Non-doped cap layer 5 may be termed a light-emitting-region cap layer, as this layer is formed after growth of the complete light emitting region, for example after the growth of the stack of QWs, QW capping layers and QW barrier layers.

The cap layer (light-emitting-region cap layer) 5 is a standard layer which is very well known in the growth schemes for III-nitride LEDs.

The thickness of cap layer can be between 5-30 nm, preferably between 5-25 nm or 5-20 nm.

Electron Blocking Layer (EBL)

After the cap layer 5, an electron blocking III-nitride layer 6 (EBL) containing Aluminium is grown. The thickness is of EBL can typically be between 10-50 nm. The Al % can be between 5-25% for example, though higher Al content is possible.

The EBL is doped with a suitable p-type doping material. The doping concentration can be between $5 \times 10^{18}$ cm$^{-3}$-$8 \times 10^{20}$ cm$^{-3}$.

Figure 10:
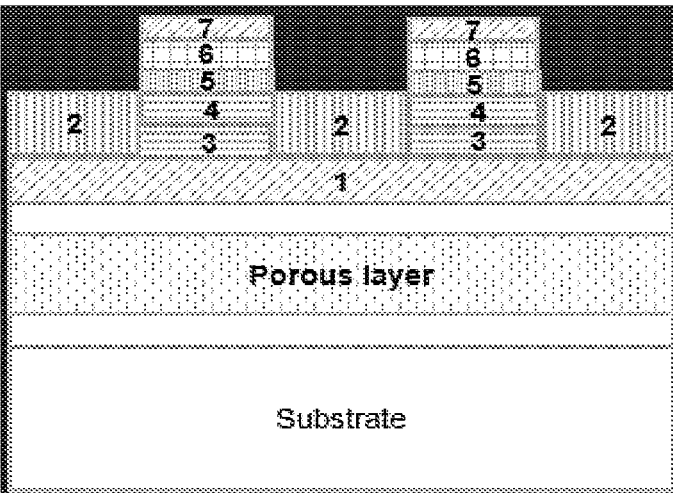

FIG. 10—First P-Doped Layer

A first p-doped layer 7 is grown above the electron blocking layer (EBL) 6.

The p-type region is preferably doped with Mg, and the p-type doping concentration of the p-type layer is preferably between $5 \times 10^{18}$ cm$^{-3}$-$8 \times 10^{20}$ cm$^{-3}$.

The p-doped III-nitride layer may contain In and Ga.

The doping layer is preferably between 20-200 nm thick, particularly preferably between 50-100 nm thick. The doping concentration may vary across the p-type layer and can have a spike in doping levels in the last 10-30 nm of the layer towards the LED surface, in order to allow better p-contact.

For activation of Mg acceptors in the p-doped layer, the structure may be annealed inside of MOCVD reactor or in an annealing oven. The annealing temperature may be in the range of 700-850 C in N2 or in N2/O2 ambient.

As both the EBL and the p-doped layer are p-type doped, these layers may be referred to as the p-doped region.

Figures 11, 12, 13:
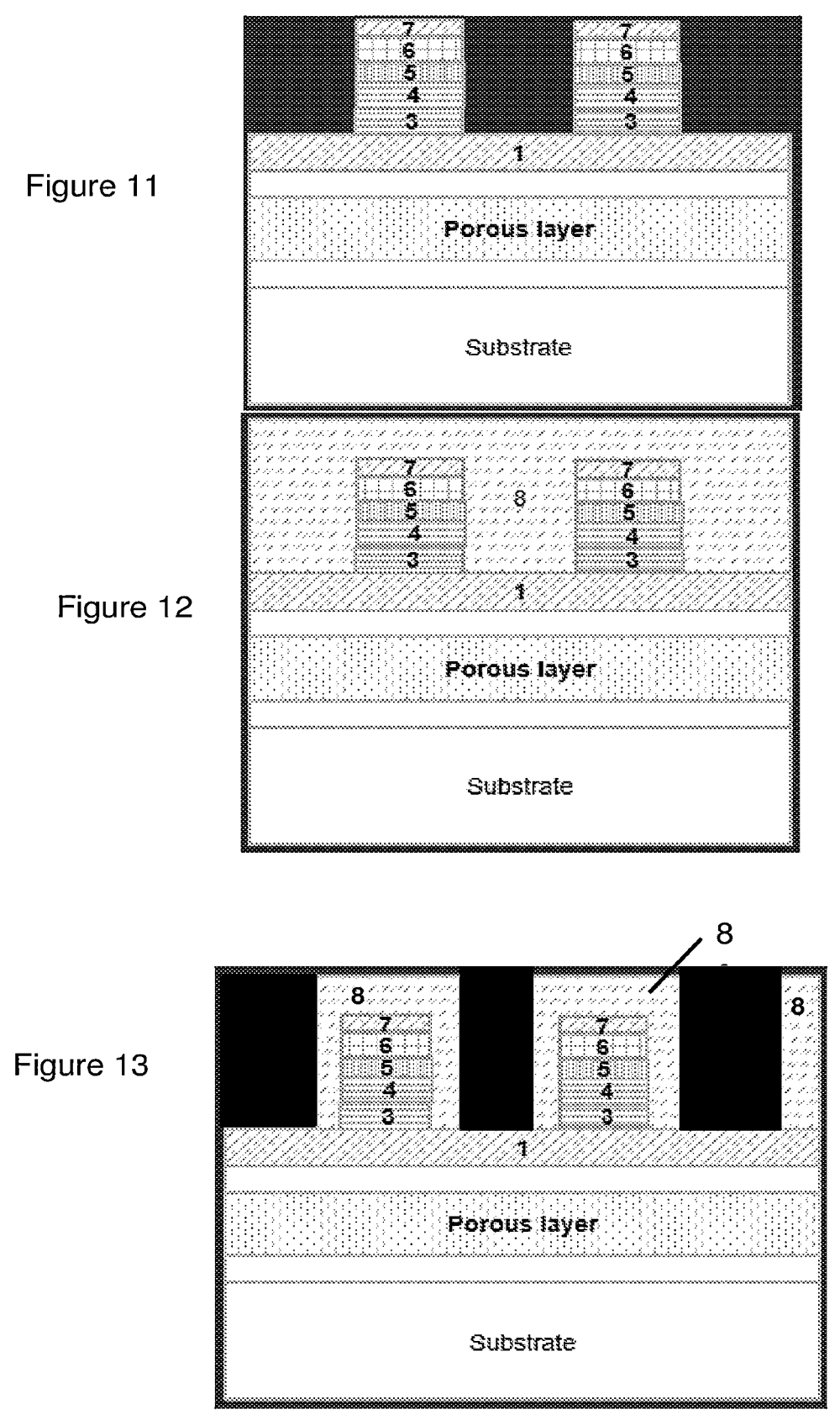

FIG. 11—Removal of First Mask Layer

The wafers are then processed to remove the first mask layer 2 from the surface of the connecting layer 1. This can be done via wet etching using buffered oxide etching chemistry.

FIG. 12—Second Mask Layer

The next step is to deposit a second mask layer 8 or a combination of passivation layers over the connecting layer 1 and the layers 3-7 of the first LED structure. The second mask layer may be formed from SiO2, SiN, SiON, Aluminium, Tantalum or hafnium containing oxide, or a combination of these layers. The second mask layer 8 is deposited via plasma enhanced chemical vapor deposition, via sputtering or any other suitable technique (e.g Atomic layer deposition). The thickness of the second mask layer 8 may vary between 20-2000 nm.

FIGS. 13—Openings in Passivation Layer

The next step is to create a plurality of second exposed regions of the connecting layer 1 by removing portions of the second mask layer 8. This can be done via standard photolithography techniques, wet or dry etching. For wet etching, a buffered oxide etch, diluted hydrofluoric acid phosphoric acid or a mixture of these can be used.

FIG. 13 shows three second exposed regions created through the second mask layer 8 to expose the surface of the connecting layer 1.

The size of the second exposed regions may be between 200 nm and 50000 nm, preferably between 500 nm and 10000 nm, or between 1000 nm and 8000 nm.

The distance between adjacent second exposed regions is preferably greater than the lateral width of the second exposed regions, preferably at least 1.5×, or at least 2× greater than the lateral width of the second exposed regions. The distance between adjacent second exposed regions may be selected so that there is space for a further LED structure to be grown in between adjacent first exposed regions.

The distance between the adjacent second exposed regions may be between 500 nm and 30000 nm, for example between 1000 nm and 10000 nm or between 5000 nm and 8000 nm.

The shape of the exposed regions can be circular, square, rectangular, hexagonal, triangular etc. The width or diameter of the openings are preferably less than 100 μm so that the LED structures formed on the exposed areas are classed as micro-LEDs. The exposed regions may preferably have a width of 0.05 μm-30 μm, particularly preferably of 10 μm or less.

Figure 14:
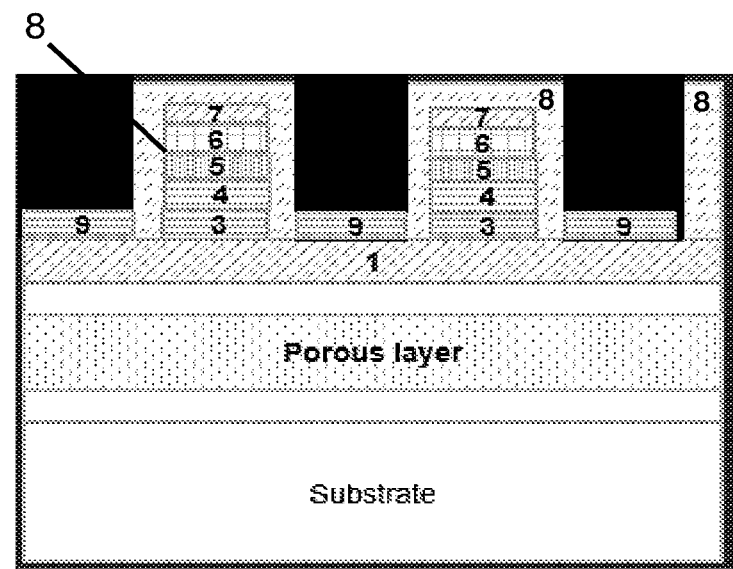

FIG. 14—Second N-Type Portion

After the second exposed regions of the connecting layer 1 are formed, a second n-doped layer 9 of III-nitride material is deposited in the second exposed regions.

In the particular example shown, a second n-doped layer 9 is grown by MOCVD. The growth takes place only inside the second exposed regions, on the surface of the n-doped connecting layer 1. Si is used as a dopant in the n-doped layer 9, with a doping concentration of at least $>1\times10^{19}$ $cm^{-3}$.

The second n-doped layer 9 may be a bulk III-nitride layer containing Indium or a stack of thin III-nitride layers with or without indium, or with a variation in atomic percentage of indium across the bulk layer or the stack. The Indium atomic percentage may vary between 0.5-25%. The total thickness of the n-type layer 9 may vary between 2 nm and 200 nm, for example between 50 nm and 100 nm. If the stack is used then the thickness of individual layer in the stack may vary between 1-40 nm. The second n-doped layer 9 may have an n-doping concentration of between $1\times10^{17}$ $cm^{-3}$-$5\times10^{20}$ $cm^{-3}$.

Figure 15:
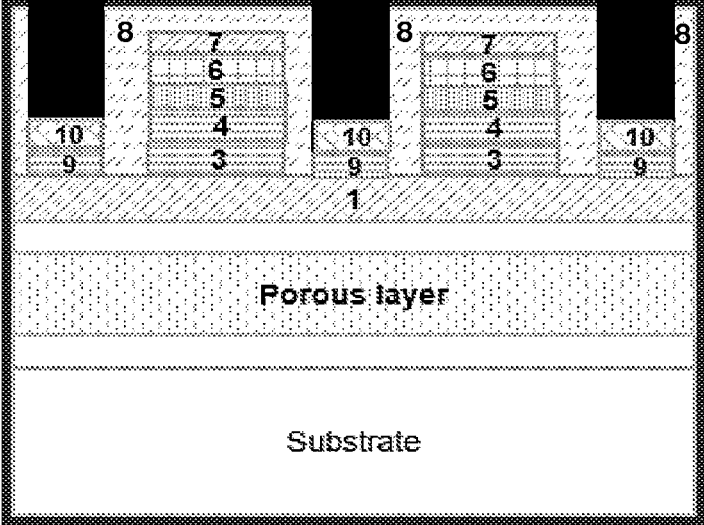

FIG. 15—Second Light Emitting Region

After growth of the second n-type layer 9 in the second exposed regions, second light-emitting regions 10 are grown over each n-type layer 9.

The second light-emitting region 10 may contain at least one light emitting layer. Each light emitting layer may be a quantum well (QW), preferably an InGaN quantum well (QW).

Preferably the light emitting region may comprise between 1-7 quantum wells. Adjacent quantum wells are separated by barrier layers of III-nitride material having a different composition to the quantum wells.

The light emitting layer(s) may be referred to as "quantum wells" throughout the present document, but may take a variety of forms. For example, the light emitting layers may be continuous layers of InGaN, or the layers may be continuous, fragmented, broken layers, contain gaps, or nanostructured so that the quantum well effectively contains a plurality of 3D nanostructures behaving as quantum dots.

The quantum wells and barriers are grown in a temperature range of 600-800° C.

Each quantum well preferably consists of an InGaN layer with atomic indium percentage between 20-40%, preferably above 26%, and preferably above 30%.

The thickness of each quantum well layer may be between 1.5-8 nm, preferably between 1.5 nm and 6 nm, or between 1.5 nm and 4 nm.

The quantum wells may or may not be capped with a thin (0.5-3 nm) III-nitride QW capping layer, which may contain one or a combination of these elements: Al, Ga, In (ternary of quaternary layer).

The QW capping layer, which (if present) is the layer added immediately after QW growth, can be AlN, AlGaN of any Al % 0.01-99.9%, GaN, InGaN of any In % 0.01-30%.

The III-nitride QW barriers separating the light emitting layers (quantum wells) may contain one or a combination of these elements: Al, Ga, In (ternary of quaternary layer).

The QW capping layer(s) and QW barriers are not indicated with individual reference numerals in the Figures, as these layers form part of the second light emitting region 10.

On completion of growth the height of the light emitting region 4 is within +1-200 nm of the height of the first mask layer 2.

The target PL emission wavelength of the second light emitting region 10 is between 570 nm-630 nm, preferably more than 600 nm. Thus the second light emitting region 10 has a different emission wavelength from the first light emitting region 4.

Figure 16:
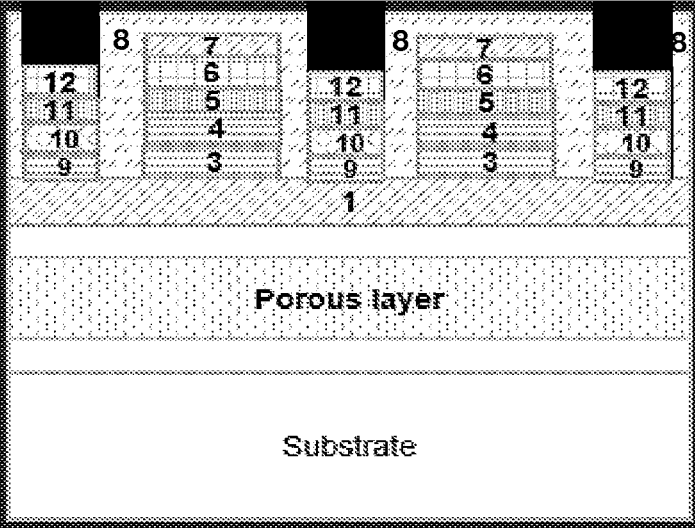

FIG. 16—Capped Layer and EBL

After growth of quantum wells a non-doped cap layer 11 and an electron blocking III-nitride layer 12 (EBL) is grown. These layers are similar or identical to cap layer 5 and EBL 6 described above.

Figure 17:
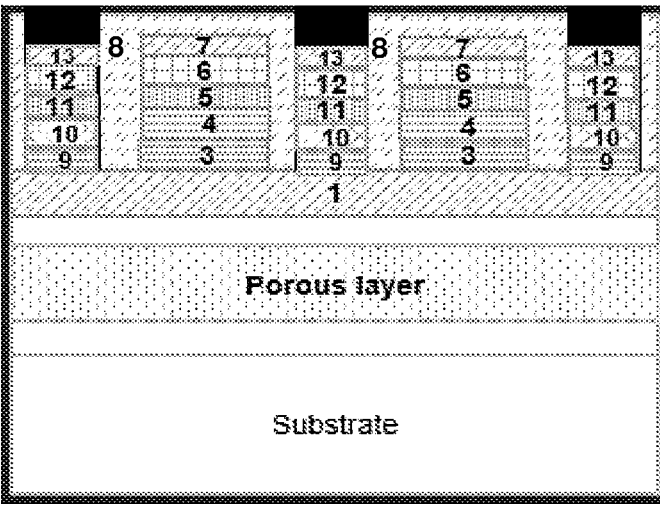

FIG. 17—Second P-Doped Layer

A second p-doped layer 13 is grown above the electron blocking layer (EBL) 12. The second p-doped layer 13 may be similar or identical to p-type layer 7 described above.

The completed second LED structure, including layers 9-13, preferably has a PL emission wavelength between 570-630 nm, and an EL emission wavelength between 600-665 nm.

Figure 18:
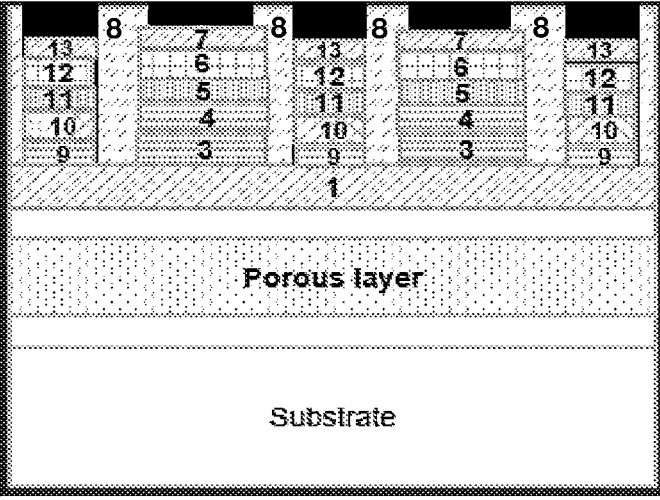
Figure 19:
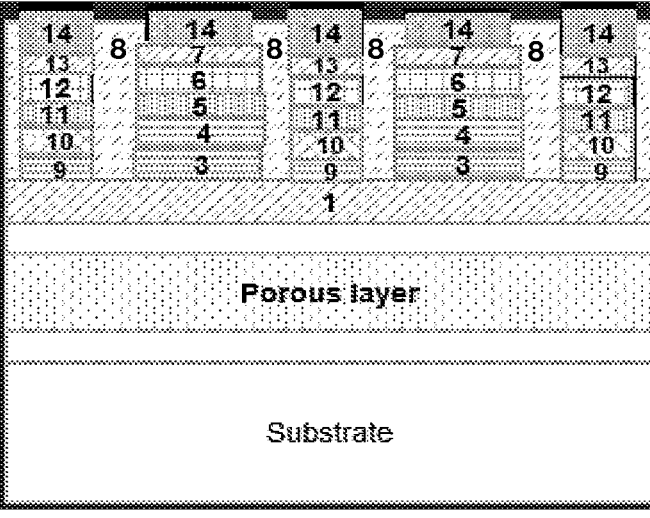
Figure 20:
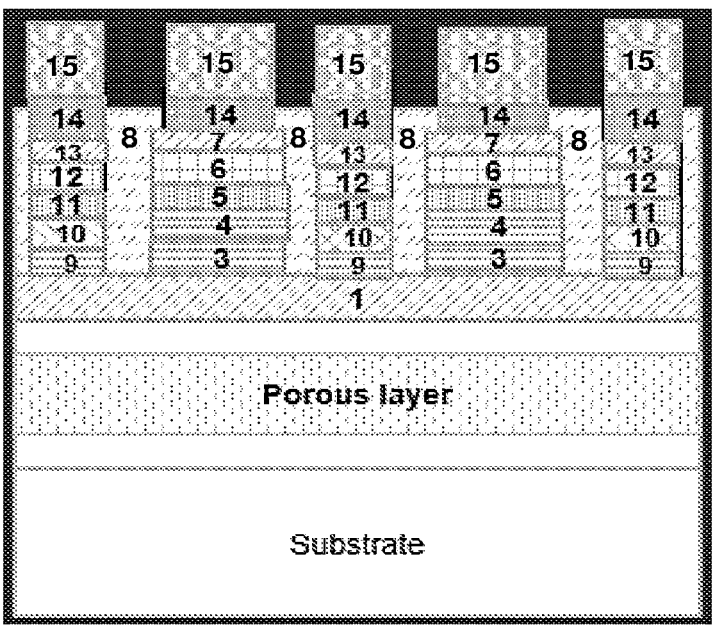

FIG. 18—Exposing First p-Doped Layer

In the next step device processing is started. The first step is to remove the second mask layer 8 only from top of the p-doped layer 7 of the first LED structure.

The removal of the second mask layer can be done with wet or dry etch methods. In case of wet etching, buffer oxide etch is used for removing the passivation layer FIG. 19—Transparent Conducting Layer The exposed first and second p-type layers 7, 13 are then covered with a transparent conducting layer 14, such as a transparent conducting oxide (e.g ITO, ZnO on other compatible oxides) or with metal layers. The covering can be done with a single step or multiple steps. The metals can be covering the pixels completely or partially. The metal may contain Ti, Pt, Pd, Rh, Ni, Au, Ag etc. The thickness of the complete metal stack can be between 200-2000 nm.

The structuring can be done be using standard semiconductor processing methods that included resist coating, photolithography and lift off.

This can be combined with dry or wet structuring so that the conducting metal layer is only fully or partially covering top of p-doped regions (regions 13 and 7)

Transparent conducting layers are well known in the art, and any suitable material and thickness may be used.

FIG. 20—P-Contacts

The next step in device fabrication is to cover the transparent conducting layers 14 on the p-doped layers 7, 13 with metal layers to act as electrical p-contacts 15. The covering can be done with a single step or multiple steps. The metals can be covering the pixels completely or partially. In this example a single step is used to simplify the details The metal may contain Ti, Pt, Pd, Rh, Ni, Au. The thickness of the complete metal stack can be between 200-2000 nm.

Figure 21:
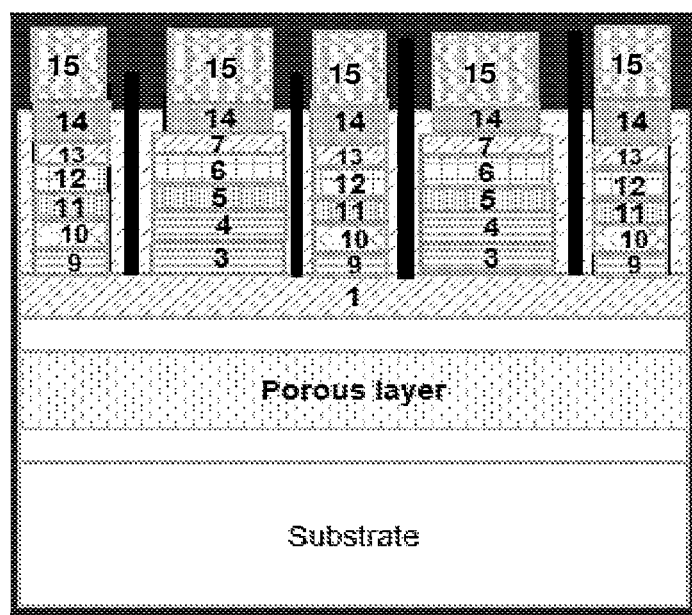

FIG. 21—Exposing Connecting Layer

Standard photolithography techniques can be used to create openings in the second mask layer 8 to expose a plurality of regions of the connecting layer 1. The size of the openings can vary between 200 nm-50000 nm. This distance between the openings can be between 500 nm-30000 nm. The opening are creating only in the regions of the wafer that are not occupied by first or second LED structures.

Dry etching is used to etch the second mask layer 8 using fluorine based gases.

FIG. 22

The final step in device fabrication is to cover the openings in oxide with metal layers to act as electrical n-contacts 16 in contact with the n-doped connecting layer 1. The covering can be done with a single step or multiple steps. The metals can be covering the pixels completely or partially. In this example a single step is used to simplify the details.

The metal may contain Ti, Pt, Pd, Rh, Ni, Au. The thickness of the complete metal stack can be between 200-2000 nm.

The illustrated micro-LED array in FIGS. 2-22 is designed to have two sets of LEDs that emit light at two different emission wavelengths: between 515-540 nm and between 570 nm-630 nm. The illustrated device is configured to emit light from the p-side of the device (the top of the micro-LED array as shown). The emission wavelengths of both the first and second light-emitting regions may be tuned as desired to obtain LEDs of whatever colour combination is desired. A third array of third LED structures may also be added to the wafer to provide arrays of LEDs emitting at three discrete wavelengths.

Red-Green-Blue LED

FIGS. 23-44 are schematic side-on cross-sections illustrating the steps of manufacturing a three colour red-green-blue LED device according to a preferred embodiment of the present invention.

FIG. 23 illustrates a semiconductor template suitable for use with the present invention. The template of FIG. 23 is similar to that in FIG. 3, except that instead of a continuous, uniformly-porous porous layer extending across the entire width of the template over the substrate, in the template of FIG. 23 the porous region is confined to a specific lateral portion of the template. The porous region is provided over approximately one third of the width of the substrate, while a non-porous region in the same plane as the porous region covers the remaining two thirds of the lateral width of the substrate. The size and shape of the porous and non-porous regions of III-nitride material can be controlled according by controlling the charge carrier concentrations of these regions during epitaxial growth, as only n-doped regions with charge carrier concentrations of greater than roughly $1 \times 10^{17}$ cm$^{-3}$ will be porosified during electrochemical etching.

The details of the numbered regions (or layers) of the device shown in FIGS. 23-44 are consistent with those described above in relation to FIGS. 1-22.

The manufacturing steps illustrated in FIGS. 23-44 are similar to those described above in relation to FIGS. 1-22.

Once the template of FIG. 23 has been prepared by electrochemical porosification of the porous region through a non-porous intermediate layer, an n-doped connecting layer 1 is formed over both the porous region and the non-porous region. A first electrically-insulating mask layer 2 is then deposited over the connecting layer 1.

A first exposed region is then formed over the porous region, and a second exposed region is formed over the non-porous region, by removing portions of the mask layer 2.

Two identical LED structures made up of layers 3 to 7 (described above in relation to FIGS. 2 to 22) are then grown. A first LED structure is grown on the first exposed region over the porous region, and a second LED structure is grown on the second exposed region over the non-porous region. The quantum wells in the light-emitting regions 4 are InGaN III-nitride layers with atomic indium percentage between 18-30%, preferably more than 22% and preferably below 30%.

The target electroluminescence emission wavelength of the region 4 may be between 515 nm-540 nm, preferably 530 nm under an electrical bias thereacross.

As described above, however, the fact that the first LED structure is positioned over a porous region of III-nitride material creates a red-shift in the emission wavelength of the first LED structure relative to the identical second LED structure. The result of this is that the light-emitting region in the second LED structure emits at a peak EL wavelength of around 515 nm-540 nm, while the wavelength-shifted first LED structure emits at a peak EL wavelength of around 580 nm-650 nm.

Once the first and second LED structures (3-7) have been grown, the first mask layer 2 is removed and a second mask layer 8 is deposited over the first and second LED structures and the connecting layer 2. A third exposed region of the connecting layer 1 is then created over the non-porous region, by removing a portion of the second mask layer 8.

A third LED structure made up of layers 9-13 is then grown (as described above) on the third exposed region. The quantum wells in the light-emitting region 10 of the third LED structure preferably consist of III-nitride layer with atomic indium percentage between 10-30%, preferably more than 12%, preferably above 15% indium, particularly preferably less than 22% indium. The target emission wavelength of the region 10 is between 400 nm-500 nm, preferably 430-470 nm, preferably more than 450 nm, under an electrical bias applied across the LED structure.

Once the third LED structure (9-13) has been formed, standard device fabrication steps are carried out, including exposing the p-doped layers 7, 13 of all three LED structures, etching channels through the connecting layer 1 between the LED structures, electrically isolating the LED structures from one another by depositing dielectric mask material 8 into the channels, applying transparent conductive oxide 14 and metal p-contacts 15 to all three LED structures, and then creating openings in the second mask layer 8 to expose the n-doped connecting layer 1, and forming metal n-contacts 16 with the connecting layer 1.

As shown in FIG. 43, the substrate may then be removed from the device. The top side of the device may be bonded to another carrier wafer/substrate/backplane 17, or to a microdriver circuit board to form an array of pixels. The bottom-side of the device may be bonded to a cover glass or transparent material 18.

As shown in FIG. 44, the substrate and the porous and non-porous region may be removed from the device. The top side of the device may be bonded to another carrier wafer/substrate/backplane 17, or to a microdriver circuit board to form an array of pixels. The bottom-side of the device may be bonded to a cover glass or transparent material 18.

The completed structure as illustrated therefore includes a first LED structure with an emission wavelength between 560-650 nm and 650-750 nm, preferably 600-650 nm. The first LED structure may therefore be a red LED.

The completed structure also includes a second LED structure with an emission wavelength between 500-560 nm, preferably 520-540 nm. The second LED structure may therefore be a green LED.

The completed structure also includes a third LED structure with an emission wavelength between 400-500 nm, preferably 430-470 nm. The third LED structure may therefore be a blue LED.

By providing all three of these LED structures in an integrated device, manufactured on the same substrate, a red-green-blue LED device is advantageously provided, in which red, green and blue LED structures form coloured pixels for light emission, particularly in which the red, green and blue pixels are formed in closer proximity than has been possible using prior art manufacturing methods.

The skilled person will understand that the emission wavelengths of the individual LED structures may be controlled by altering the composition and layer structures of the LED structures according to known principles of LED construction. Thus a variety of multi-coloured LED devices may be provided using the present invention, and colour combinations other than red, green and blue may of course be provided.

Red Shift

Figure 45:
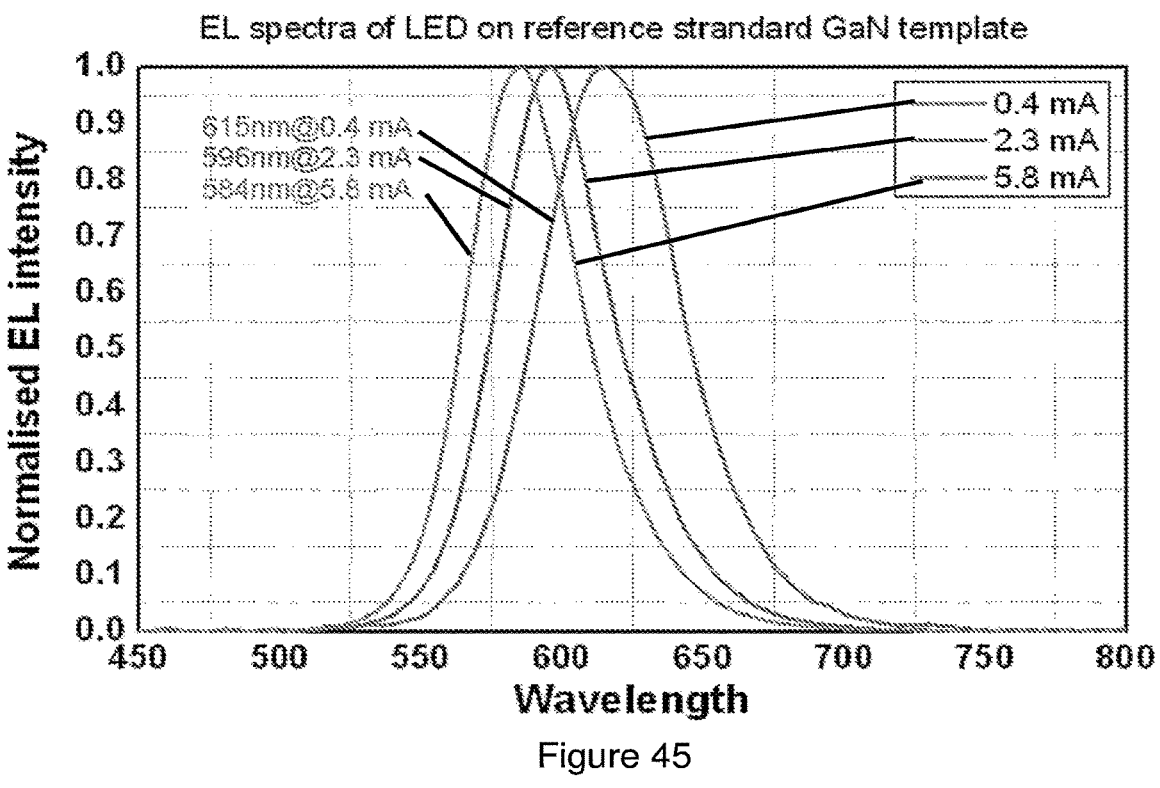
FIG. 45 is a graph of normalised electroluminescence (EL) intensity vs wavelength at different current injections, for an InGaN LED on a non-porous substrate.
Figure 46:
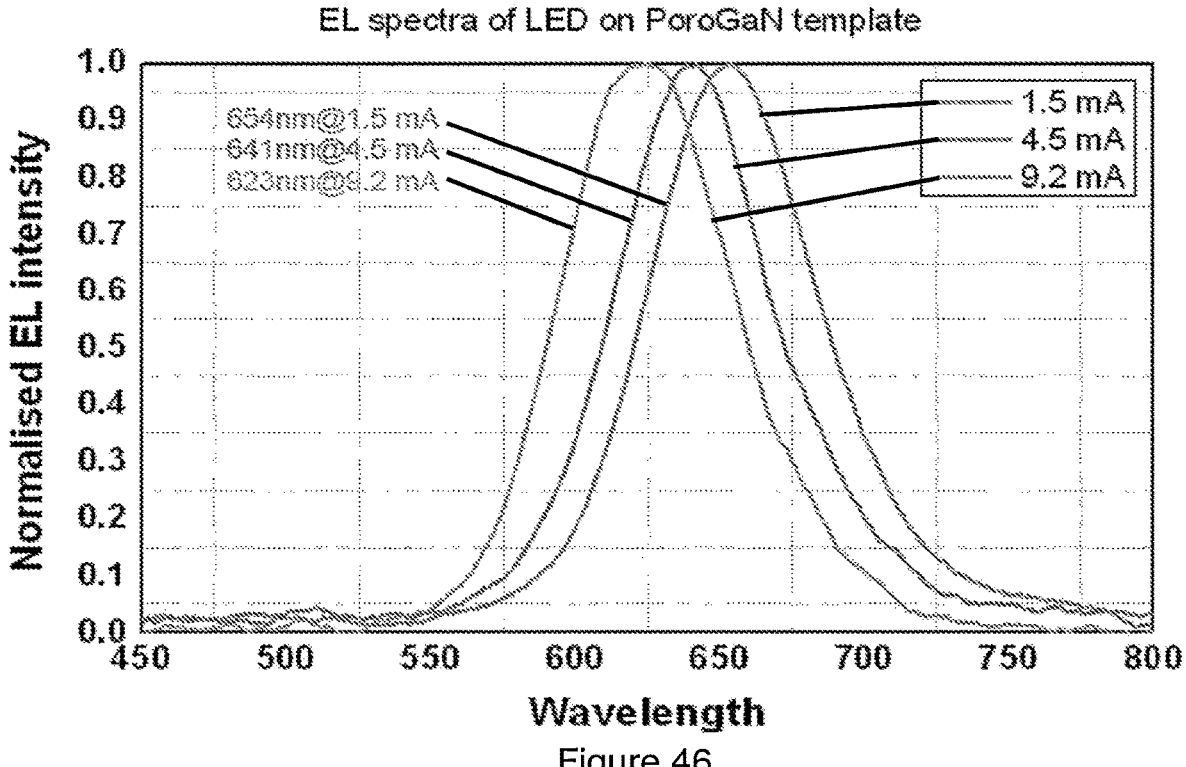
FIG. 46 is a graph of normalised electroluminescence (EL) intensity vs wavelength at different current injections, for the same InGaN LED as FIG. 45 grown over a porous region according to a preferred embodiment of the present invention

FIGS. 45 and 46 compare the emission characteristics of an InGaN LED on a non-porous substrate (FIG. 45) and the same InGaN LED grown on a template comprising a porous layer of III-nitride material. Comparison of these two graphs demonstrates the shift towards longer emission wavelengths caused by the porous underlayer, as the emission of the LED on the porous template is consistently between 21 nm and 45 nm longer than that of the same LED on the non-porous template. Thus when the first LED structure is grown over the porous region and the identical second LED structure is grown over the non-porous region, the first LED structure light emits at a longer wavelength than the second LED structure.

Alternative Embodiment

Figure 47:
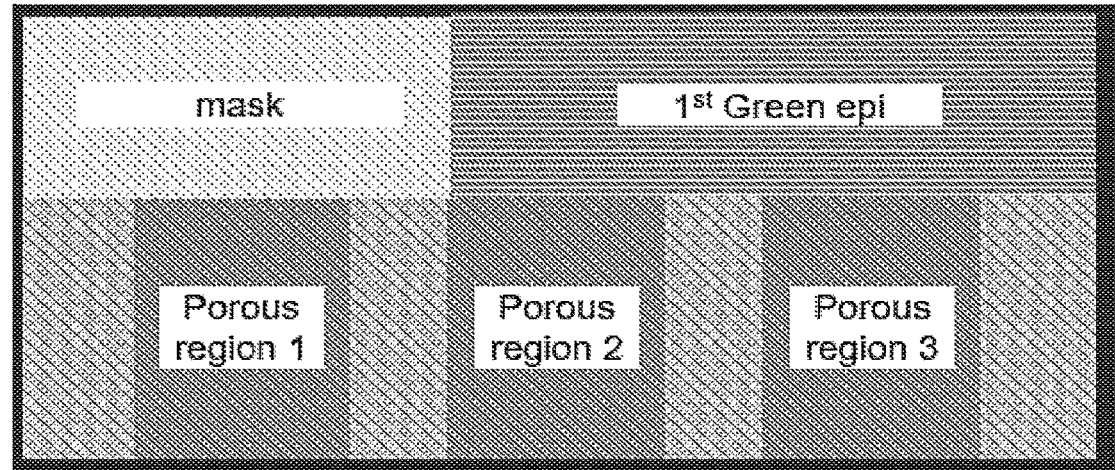
FIGS. 47 and 48 illustrate an alternative method of preparing a red-green-blue LED device according to a preferred embodiment of the present invention.
Figure 48:
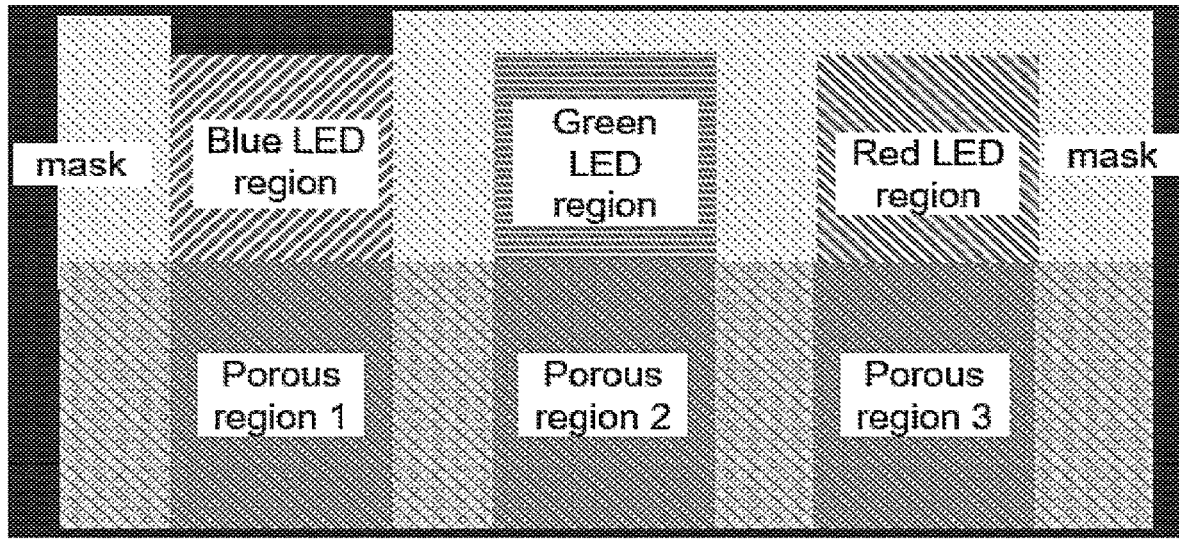

FIGS. 47 and 48 illustrate an alternative method of preparing a red-green-blue LED device according to a preferred embodiment of the present invention.

A template is provided, in which three porous regions having different porosities are positioned in the same plane, at three different lateral positions in a layer of semiconductor material. An n-doped connecting layer (not shown) covers all three porous regions.

First, a mask is deposited over the top of Porous region 1, leaving an exposed region of the connecting layer over Porous regions 2 and 3. A green LED structure is then formed on the connecting layer over Porous regions 2 and 3. The green LED structure is then divided in two by conventional etching processes to leave a first LED structure positioned above Porous Region 3, and a second LED structure positioned above Porous Region 2.

Another mask layer is deposited to cover the first LED structure and the second LED structure. A portion of the mask layer is then removed to expose a region of the connecting layer above Porous Region 1. A blue LED structure is then formed on the exposed region of the connecting layer above Porous region 1.

All three LED structures are then processed into device structures with the same LED processing steps described above.

In this embodiment, the difference in porosity between Porous region 1 and Porous region 2 will create different first and second emission wavelengths, even though the first and second LED structures themselves are the same. In the illustrated embodiment, the porosity of Porous region 1 causes a wavelength shift so that the first LED structure emits red light under an applied electrical bias. Thus a green LED and a red LED may be formed simultaneously, using the same epitaxial growth steps.

In various embodiments, instead of Porous regions 1 and 2, the second and/or third LED structures may be formed over non-porous regions of III-nitride material.

The invention claimed is:

1. A method of manufacturing an LED device, comprising the steps of:
   forming an n-doped connecting layer of III-nitride material over a porous region of III-nitride material;
   forming a first electrically-insulating mask layer on the n-doped connecting layer;
   removing a portion of the first mask layer to expose a first exposed region of the n-doped connecting layer;
   forming a first LED structure, which is configured to emit light at a first emission wavelength, on the first exposed region of the n-doped connecting layer;
   forming a second electrically-insulating mask layer over the first LED structure and the n-doped connecting layer;
   removing a portion of the second mask layer to expose a second exposed region of the n-doped connecting layer; and
   forming a second LED structure, which is configured to emit light at a second emission wavelength different from the first emission wavelength, on the second exposed region of the n-doped connecting layer,
   in which the n-doped connecting layer of III-nitride material is formed over the porous region of III-nitride material and a non-porous region of III-nitride material, the porous region being disposed in a plane of the LED device and the non-porous region being disposed in the same plane.

2. A method according to claim 1, in which one of the first LED structure and the second LED structure is positioned over the porous region, and the other is positioned over the non-porous region, or in which both the first LED structure and the second LED structure are positioned over the porous region.

3. A method according to claim 1, comprising the step of forming the porous region of III-nitride material by electrochemical porosification through a non-porous layer of III-nitride material, such that the non-porous layer of III-nitride material forms a non-porous intermediate layer over the porous region prior to forming the n-doped connecting layer, and optionally comprising the step of etching the non-porous intermediate layer to reduce its thickness, prior to forming the n-doped connecting layer of III-nitride material over the non-porous intermediate layer.

4. A method according to claim 1, in which the porous region of III-nitride material comprises a stack of multiple porous layers of III-nitride material; in which the stack of porous layers is a stack of alternating porous and non-porous layers.

5. A method according to claim 1, in which the porous region has a porosity of between 10% and 90% porous and/or in which the n-doped connecting layer of III-nitride material has a thickness of between 100 nm and 2000 nm and a charge carrier concentration of $>1 \times 10^{17}$ cm$^{-3}$.

6. A method according to claim 1, in which the first mask layer is formed from one of: $SiO_2$, SiN, SiON, and/or the second mask layer is formed from one of: $SiO_2$, SiN, SiON, aluminium oxide, tantalum oxide, hafnium oxide, or a combination thereof and/or in which the first electrically-insulating mask layer or the second electrically-insulating mask layer has a thickness of between 20 nm and 1000 nm.

7. A method according to claim 1, in which the first exposed region and/or the second exposed region of the connecting layer are circular, square, rectangular, hexagonal, or triangular in shape and/or in which the first exposed region and/or the second exposed region have a width of between 0.05 μm and 100 μm.

8. A method according to claim 1, comprising the step of, after the second LED structure has been formed, removing a portion of the second electrically-insulating mask layer to expose a region of the first LED structure; and forming an electrical contact in the exposed region of the first LED structure.

9. A method according to claim 1, comprising the step of exposing a portion of the n-doped connecting layer, and forming an electrical contact in the exposed portion of the n-doped connecting layer.

10. A method of manufacturing a three colour LED device, comprising the steps of:

forming an n-doped connecting layer of III-nitride material over a porous region of III-nitride material and a non-porous region of III-nitride material;

forming a first electrically-insulating mask layer on the n-doped connecting layer;

removing a portion of the first mask layer to expose a first exposed region of the n-doped connecting layer over the porous region, removing a portion of the first mask layer to expose a second exposed region of the n-doped connecting layer over the non-porous region;

forming a first LED structure, which is configured to emit light at a first emission wavelength, on the first exposed region of the n-doped connecting layer;

forming a second LED structure, which is configured to emit light at a second emission wavelength, on the second exposed region of the n-doped connecting layer;

forming a second electrically-insulating mask layer over the first LED structure, the second LED structure, and the n-doped connecting layer;

removing a portion of the second mask layer to expose a third exposed region of the n-doped connecting layer; and forming a third LED structure, which is configured to emit light at a third emission wavelength different from the first emission wavelength and the second emission wavelength, on the third exposed region of the n-doped connecting layer.

11. A method according to claim 10, in which the second LED structure is identical to the first LED structure, and in which the first LED structure and the second LED structure are formed simultaneously, and/or in which the third exposed region of the n-doped connecting layer is formed above the non-porous region of III-nitride material.

12. An LED device, comprising:

an n-doped connecting layer of III-nitride material over a porous region of III-nitride material;

an electrically-insulating mask layer on the n-doped connecting layer;

a first LED structure, configured to emit light at a first emission wavelength, and a second LED structure, configured to emit light at a second emission wavelength different from the first emission wavelength, in which a portion of the first and second LED structures extend through a gap in the electrically-insulating mask layer, and are in contact with the n-doped connecting layer, in which the n-doped connecting layer of III-nitride material extends over the porous region of III-nitride material and a non-porous region of III-nitride material, the porous region being disposed in a plane of the LED device and the non-porous region being disposed in the same plane.

13. An LED device according to claim 12, in which one of the first LED structure and the second LED structure is positioned over the porous region and the other is positioned over the non-porous region, or in which both the first LED structure and the second LED structure are positioned over the porous region.

14. An LED device according to claim 12, in which the first LED structure comprises:

a first n-doped portion;

a first p-doped portion; and a first light emitting region located between the first n-doped portion and the first p-doped portion, and the second LED structure comprises:

a second n-doped portion;

a second p-doped portion; and a second light emitting region located between the second n-doped portion and the second p-doped portion.

15. An LED device according to claim 14, in which the first light-emitting region and/or the second light-emitting region comprises one or more III-nitride light-emitting layers, and in which the or each light-emitting layer comprises a quantum well, or a nanostructured layer comprising quantum dots, or fragmented or discontinuous quantum wells.

16. An LED device according to claim 15, in which the one or more light-emitting layers in the first LED structure have a composition $In_xGa_{1-x}N$, in which $0.10 \leq x \leq 0.40$, or $0.18 \leq x \leq 0.30$, or $0.22 \leq x \leq 0.30$, and/or in which the one or more light-emitting layers in the second LED structure have a composition $In_yGa_{1-y}N$, in which $0.20 \leq y \leq 0.40$, or $0.26 \leq y \leq 0.40$, or $0.30 \leq y \leq 0.40$.

17. A three colour LED device, comprising:

an n-doped connecting layer of III-nitride material over a porous region of III-nitride material;

an electrically-insulating mask layer on the n-doped connecting layer;

a first LED structure, configured to emit light at a first emission wavelength, a second LED structure, configured to emit light at a second emission wavelength different from the first emission wavelength, and a third LED structure, configured to emit light at a third emission wavelength different from the first and second emission wavelengths, in which a portion of the first, second and third LED structures are in contact with the n-doped connecting layer, and in which the first LED structure is positioned over the porous region of III-nitride material, and the second LED structure is not positioned over the porous region of III-nitride material.

18. A three colour LED device according to claim 17, in which one or more light-emitting layers in the first LED structure and the second LED structure have the composition $In_xGa_{1-x}N$, in which $0.10 \leq x \leq 0.40$, or $0.18 \leq x \leq 0.30$, or $0.22 \leq x \leq 0.30$.

19. A three colour LED device according to claim 18, in which the second LED structure is identical to the first LED structure, and in which the first LED structure and the second LED structure emit light at different emission wavelengths due to the porous region beneath the first LED structure.

20. A three colour LED device according to claim 17, in which the third LED structure is not positioned over the porous region of III-nitride material, and/or in which the third LED structure is configured to emit light at a peak wavelength between 400 and 500 nm under electrical bias thereacross.

21. A three colour LED device according to claim 17, in which one or more light-emitting layers in the third LED structure have a composition $In_zGa_{1-z}N$, in which $0.10 \leq z \leq 0.30$, or $0.12 \leq z \leq 0.25$, or $0.15 \leq z \leq 0.20$.

22. A three colour LED device according to claim 17, in which the first, second and third LED structures are configured so that:

the first LED structure emits light at a peak wavelength between 600 and 650 nm under electrical bias thereacross;

the second LED structure emits light at a peak wavelength between 515 and 550 nm under electrical bias thereacross; and the third LED structure emits light at a peak wavelength between 415 and 500 nm under electrical bias thereacross.

\* \* \* \* \*